(12) United States Patent
Lee et al.

(10) Patent No.: US 8,775,719 B2
(45) Date of Patent: *Jul. 8, 2014

(54) NAND-BASED HYBRID NVM DESIGN THAT INTEGRATES NAND AND NOR IN 1-DIE WITH PARALLEL INTERFACE

(75) Inventors: Peter W. Lee, Saratoga, CA (US);
Fu-Chang Hsu, San Jose, CA (US);
Kesheng Wang, San Jose, CA (US)

(73) Assignee: Aplus Flash Technology, Inc., Fremont, CA (US)

( * ) Notice: Subject to any disclaimer, the term of this patent is extended or adjusted under 35 U.S.C. 154(b) by 923 days.

This patent is subject to a terminal disclaimer.

(21) Appl. No.: 12/807,996

(22) Filed: Sep. 17, 2010

(65) Prior Publication Data

US 2011/0072200 A1     Mar. 24, 2011

Related U.S. Application Data

(60) Provisional application No. 61/277,208, filed on Sep. 21, 2009.

(51) Int. Cl.
*G06F 12/00* (2006.01)

(52) U.S. Cl.
USPC .................... 711/103; 711/114; 711/E12.001

(58) Field of Classification Search
USPC ................................... 711/114, 103, E12.001
See application file for complete search history.

(56) References Cited

U.S. PATENT DOCUMENTS

| | | | |
|---|---|---|---|
| 5,603,001 A * | 2/1997 | Sukegawa et al. | ............ 711/103 |
| 5,805,854 A | 9/1998 | Shigeeda | |
| 5,966,723 A | 10/1999 | James et al. | |
| 6,687,154 B2 | 2/2004 | Lee et al. | |
| 6,862,223 B1 | 3/2005 | Lee et al. | |
| 7,064,978 B2 | 6/2006 | Lee et al. | |
| 7,075,826 B2 | 7/2006 | Lee et al. | |
| 7,102,929 B2 | 9/2006 | Lee et al. | |
| 7,106,636 B2 | 9/2006 | Eilert et al. | |
| 7,110,302 B2 | 9/2006 | Lee et al. | |
| 7,120,064 B2 | 10/2006 | Lee et al. | |
| 7,283,401 B2 | 10/2007 | Lee et al. | |

(Continued)

OTHER PUBLICATIONS

Co-pending US Patent AP09-006, U.S. Appl. No. 12/807,080, filed Aug. 27, 2010, "A Novel NAND-Based Hybrid NVM Design that Integrates NAND and NOR in 1-Die with Serial Interface," assigned to the same assignees as the present invention.

(Continued)

*Primary Examiner* — Larry Mackall
(74) *Attorney, Agent, or Firm* — Saile Ackerman LLC; Stephen B. Ackerman; Billy Knowles

(57) ABSTRACT

A nonvolatile memory device includes multiple independent nonvolatile memory arrays that concurrently for parallel reading and writing the nonvolatile memory arrays. A parallel interface communicates commands, address, device status, and data between a master device and nonvolatile memory arrays for concurrently reading and writing of the nonvolatile memory arrays and sub-arrays. Data is transferred on the parallel interface at the rising edge and the falling edge of the synchronizing clock. The parallel interface transmits a command code and an address code from a master device and transfers a data code between the master device and the nonvolatile memory device, wherein the data code has a length that is determined by the command code and a location determined by the address code. Reading one nonvolatile memory array may be interrupted for reading another. One reading operation has two sub-addresses with one transferred prior to a command.

42 Claims, 26 Drawing Sheets

(56) References Cited

U.S. PATENT DOCUMENTS

| | | |
|---|---|---|
| 7,289,366 B2 | 10/2007 | Lee et al. |
| 7,324,384 B2 | 1/2008 | Lee et al. |
| 7,369,438 B2 | 5/2008 | Lee |
| 7,372,736 B2 | 5/2008 | Lee et al. |
| 7,636,252 B2 | 12/2009 | Lee et al. |
| 2003/0196059 A1* | 10/2003 | Satagopan et al. ............ 711/169 |
| 2005/0172067 A1* | 8/2005 | Sinclair ........................ 711/103 |
| 2006/0176738 A1 | 8/2006 | Lee et al. |
| 2006/0271727 A1* | 11/2006 | Wang et al. ................... 711/103 |
| 2008/0022396 A1* | 1/2008 | Kado ............................. 726/19 |
| 2008/0034259 A1 | 2/2008 | Ko et al. |
| 2008/0096327 A1 | 4/2008 | Lee et al. |
| 2009/0067240 A1* | 3/2009 | Roohparvar et al. .... 365/185.03 |
| 2009/0196102 A1 | 8/2009 | Kim |

OTHER PUBLICATIONS

Co-pending US Patent AP09-007, U.S. Appl. No. 12/807,997, filed Sep. 17, 2010, "A Novel NAND-Based Hybrid NVM Design that Integrates NAND and NOR in 1-Die with Serial Interface," assigned to the same assignees as the present invention.

International Search Report PCT/US 10/02553 Mail date—Nov. 10, 2010, APLUS Flash Technology, Inc.

* cited by examiner

| Signal Name | Input / Output | Description |
|---|---|---|
| R/B# | O | Ready/Busy<br>The Ready/Busy signal indicates the target status. When low, the signal indicates that one or more NAND and/or NOR Array operations are in progress. |
| RE# | I | Read Enable<br>The Read Enable signal enables serial data output. |
| CE# | I | Chip Enable<br>The Chip Enable signal selects the target NAND Array or NOR Array, When Chip Enable is low, the target NAND Array or NOR Array is selected. |
| Vcc | I | Power<br>The Vcc signal is the power supply to the device. |
| Vss | I | Ground<br>The Vss signal is the power supply ground. |
| CLE | I | Command Latch Enable<br>The Command Latch Enable signal is one of the signals used by the Host Electronic Device to indicate that a command is present on the Parallel Interface I/O Bus. |
| ALE | I | Address Latch Enable<br>The Address Latch Enable signal is one of the signals used by the Host Electronic Device to indicate that an address is present on the Parallel Interface I/O Bus. |
| CLK | I | Clock<br>The Clock signal synchronizes the Command, Address, and Data transfer on the Parallel Interface I/O Bus. |
| IO0 – IO15 | I/O | I/O Port, bits 0-15<br>The Parallel Interface I/O Bus is a bidirectional port for transferring address, command, and data to and from the Nonvolatile Memory Device. |

FIG. 1b

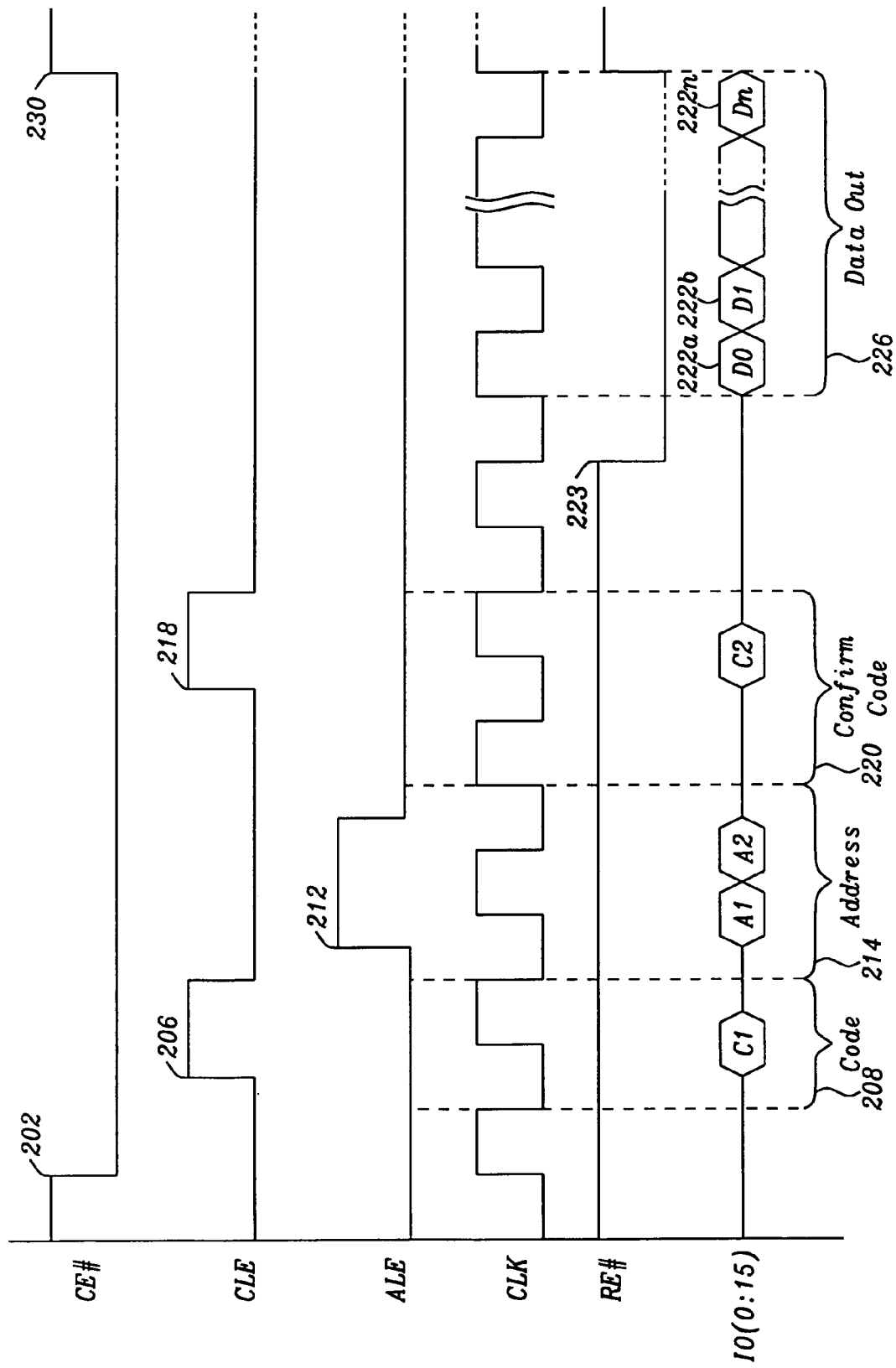

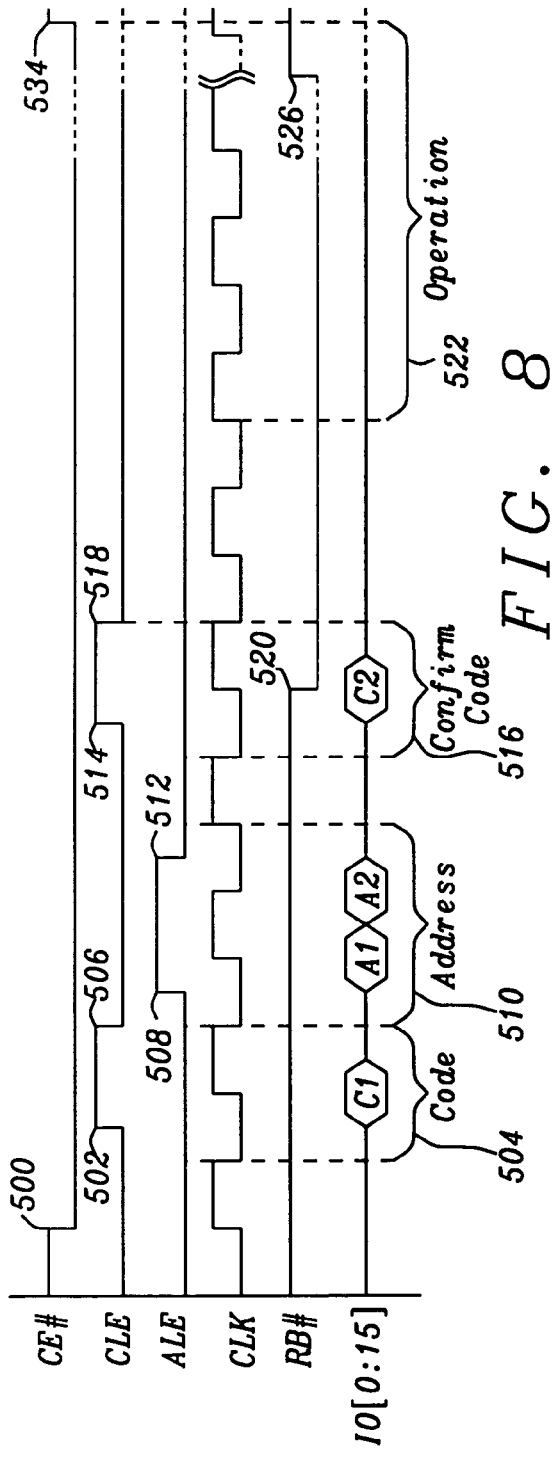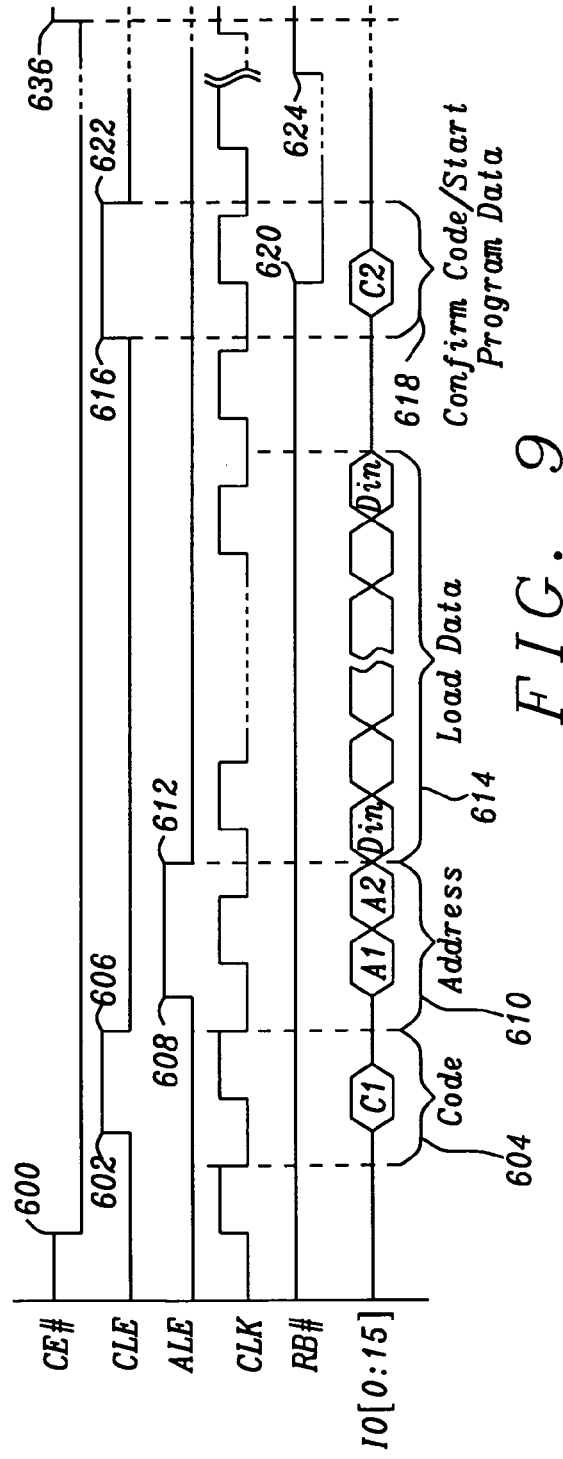

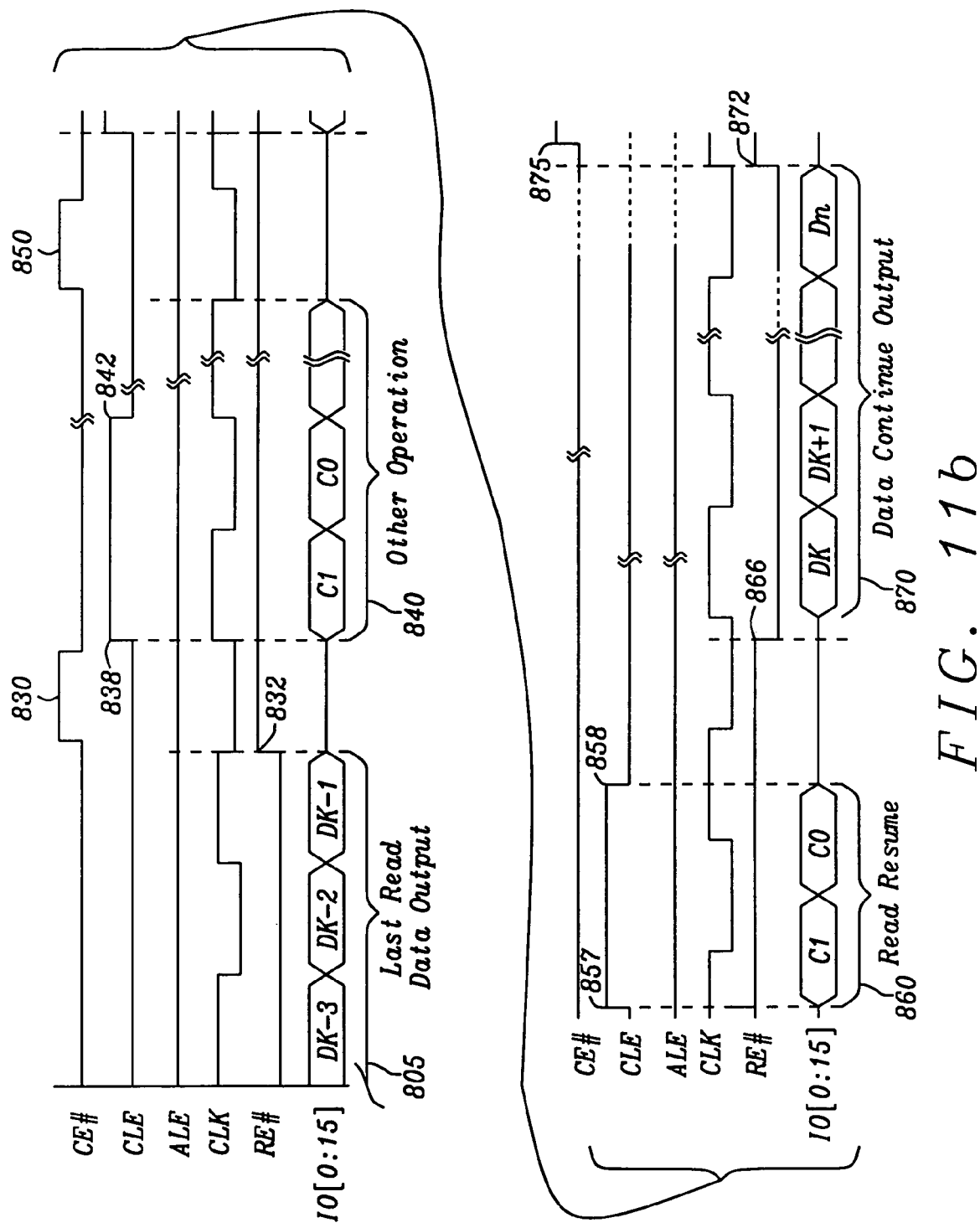

| Operational Mode | Command Input | DQ[15:0] | Figs. for Operation |
|---|---|---|---|
| Rd NOR While NOR Wrt | NOR Rd Cmd | Output NOR data | Fig. 8 or Fig. 9 followed by Fig. 5b |
| Rd NOR While NAND Wrt | NOR Rd Cmd | Output NOR data | Fig. 8 or Fig. 9 followed by Fig. 5b |
| Rd NOR While NAND & NOR Wrt | NOR Rd Cmd | Output NOR data | 2 successive Fig. 8 or Fig. 9 followed by Fig. 5b |
| Rd NOR While NAND Rd | NOR Rd Cmd | Switch from output NAND data to Output NOR data | Fig. 6b or Fig. 7b |
| Rd NOR While Others Idle | NOR Rd Cmd | Output NOR data | Fig. 5b |
| Wrt NOR While NOR Rd | NOR Wrt Cmd | Output NOR data | Fig. 11b with Fig. 5b during dummy cycle |
| Wrt NOR While NAND Rd | NOR Wrt Cmd | Don't care | Fig. 11b with Fig. 5b during dummy cycle |
| Wrt NOR While NAND Wrt | NOR Wrt Cmd | Don't care | Fig. 8 or Fig. 9 (NAND) followed by Fig. 9 or Fig. 9 (NOR) |
| Wrt NOR While Others Idle | NOR Wrt Cmd | Don't care | Fig. 8 or Fig. 9 |

FIG. 14a

| Operational Mode | Command Input | DQ[15:0] | Figs. for Operation |
|---|---|---|---|
| Rd NAND While NAND Wrt | NAND Rd Cmd | Output NAND data | Fig. 8/Fig. 9 (ANAMD) followed by Fig. 5b (NAND) |
| Rd NAND While NOR Wrt | NAND Rd Cmd | Output NAND data | Fig. 8/Fig. 9 (NOR) followed by Fig. 5b (NAND) |
| Rd NAND While NAND & NOR Wrt | NAND Rd Cmd | Output NAND data | 2 successive Fig. 8/ Fig. 9 followed by Fig. 5b |
| Rd NAND While NOR Rd | NAND Rd Cmd | Switch from output NOR data to Output NAND data | Fig. 6b/Fig. 7b |
| Rd NAND While Others Idle | NAND Rd Cmd | Output NAND data | Fig. 5b |
| Wrt NAND While NAND Rd | NAND Wrt Cmd | Output NAND data | Fig. 11b with Fig. 8/Fig. 9 during dummy cycle |
| Wrt NAND While NOR Rd | NAND Wrt Cmd | Don't care | Fig. 11b with Fig. 8/Fig. 9 during dummy cycle |
| Wrt NAND While NOR Wrt | NAND Wrt Cmd | Don't care | Fig. 8/Fig. 9 (NAND) followed by Fig. 8/Fig. 9 (NOR) |
| Wrt NAND While Others Idle | NAND Wrt Cmd | Don't care | Fig. 8/Fig. 9 |

FIG. 14b

| Operational Mode | Command Input | DQ[15:0] | Figs. for Operation |
|---|---|---|---|
| Read Status Register | NAND/NOR Rd Cmd | Output NAND/NOR Data | Fig. 10 |
| Read Resume | NAND/NOR Rd Cmd - Other Op CMd Dependent | Output NAND/NOR for Resume - "Other Operation COmmand Dependent | Fig. 11b |
| Read Jump | NAND/NOR Rd Cmd Interrupt w/ NAND/NOR Rd Cmd No Resume | Output 1st NAND/NOR Data then Jump to 2nd NAND/NOR Data | Fig. 12b |
| Address Ahead Input Read | NAND/NOR Read w/ Discrete Row Address & Column Address | Output: NAND/NOR Data | Fig. 13b |

*FIG. 14C*

NAND-BASED HYBRID NVM DESIGN THAT INTEGRATES NAND AND NOR IN 1-DIE WITH PARALLEL INTERFACE

This application claims priority under 35 U.S.C. §119 to U.S. Provisional Patent Application Ser. No. 61/277,208, filed on Sep. 21, 2009, which is herein incorporated by reference in its entirety.

RELATED PATENT APPLICATIONS

U.S. patent application Ser. No. 12/807,997, filed on Sep. 17, 2010, assigned to the same assignee as the present invention, and incorporated herein by reference in its entirety.

U.S. patent application Ser. No. 12/807,080, filed on Aug. 27, 2010, assigned to the same assignee as the present invention, and incorporated herein by reference in its entirety.

BACKGROUND OF THE INVENTION

1. Field of the Invention

This invention relates generally to a nonvolatile memory devices. More particularly this invention relates to circuits and methods for executing protocols for communicating between nonvolatile memory arrays and external systems. Even more particularly, this invention relates to circuits and methods for controlling operation of multiple NAND and NOR flash memory arrays and communicating between the NAND and NOR flash memory arrays and external control systems.

2. Description of Related Art

Nonvolatile memory is well known in the art. The different types of nonvolatile memory include Read-Only-Memory (ROM), Electrically Programmable Read Only Memory (EPROM), Electrically Erasable Programmable Read Only Memory (EEPROM), NOR Flash Memory, and NAND Flash Memory. In current applications such as personal digital assistants, cellular telephones, notebook and laptop computers, voice recorders, global positioning systems, etc., the Flash Memory has become one of the more popular types of Nonvolatile Memory. Flash Memory has the combined advantages of the high density, small silicon area, low cost and can be repeatedly programmed and erased with a single low-voltage power supply voltage source.

A present day flash nonvolatile memory is divided into two major product categories such as the fast random-access, asynchronous NOR flash nonvolatile memory and the slower serial-access, synchronous NAND flash nonvolatile memory. NOR flash nonvolatile memory as presently designed is the high pin-count memory with multiple external address and data pins along with appropriate control signal pins. One disadvantage of NOR flash nonvolatile memory is as the density is doubled, the number of its required external pin count increases by one due to the adding of one more external address pin to double the address space. In contrast, NAND flash nonvolatile memory has an advantage of having a smaller pin-count than NOR with no address input pins. As density increases, the NAND flash nonvolatile memory pin count is always kept constant. Both main-streamed NAND and NOR flash nonvolatile memory cell structures in production at the present time use one charge retaining (charge storage or charge trapping) transistor memory cell that stores one bit of data as charge or as it commonly referred to as a single-level program cell (SLC). They are respectively referred as one-bit/one transistor NAND cell or NOR cell, storing a single-level programmed data in the cell.

The NAND and NOR flash nonvolatile memories provide the advantage of in-system program and erase capabilities and have a specification for providing at least 100K endurance cycles. In addition, both single-chip NAND and NOR flash nonvolatile memory products can provide giga-byte density because their highly-scalable cell sizes. For instance, presently a one-bit/one transistor NAND cell size is kept at $\sim 4\lambda^2$ ($\lambda$ being a minimum feature size in a semiconductor process), while NOR cell size is $\sim 10\lambda^2$. Furthermore, in addition to storing data as a single-level program cell having two voltage thresholds (Vt0 and Vt1), both one transistor NAND and NOR flash nonvolatile memory cells are capable of storing at least two bits per cell or two bits/one transistor with four multi-level threshold voltages (Vt0, Vt1, Vt2 and Vt03) in one physical cell. The multi-level threshold voltage programming of the one transistor NAND and NOR flash nonvolatile memory cells is referred to as multiple level programmed cells (MLC).

Currently, the highest-density of a single-chip double polycrystalline silicon gate NAND flash nonvolatile memory chip is 64 Gb. In contrast, a double polycrystalline silicon gate NOR flash nonvolatile memory chip has a density of 2 Gb. The big gap between NAND and NOR flash nonvolatile memory density is a result of the superior scalability of NAND flash nonvolatile memory cell over a NOR flash nonvolatile memory. A NOR flash nonvolatile memory cell requires 5.0V drain-to-source (Vds) to maintain a high-current Channel-Hot-Electron (CHE) injection programming process. Alternately, a NAND flash nonvolatile memory cell requires 0.0V between the drain to source for a low-current Fowler-Nordheim channel tunneling program process. The above results in the one-bit/one transistor NAND flash nonvolatile memory cell size being only one half that of a one-bit/one transistor NOR flash nonvolatile memory cell. This permits a NAND flash nonvolatile memory device to be used in applications that require huge data storage. A NOR flash nonvolatile memory device is extensively used as a program-code storage memory which requires less data storage and requires fast and asynchronous random access.

The current consumer portable applications require a high speed, high density, and low cost nonvolatile memory solution. The "Open NAND Flash Interface Specification", Revision 2.3, Aug. 25, 2010, Open NAND Flash Interface working group (ONFI) defines a standardized NAND Flash device interface and protocol for providing the way for a system to be designed that supports a range of NAND Flash devices without direct design pre-association. The ONFI interface provides support for a range of device capabilities and future development of NAND nonvolatile memory devices. The ONFI interface supports asynchronous and source synchronous operation and the ONFI working group has proposed many powerful functions such as "EZ NAND". The "EZ NAND" includes the control logic packaged together with NAND to perform the NAND management functionality that is lithography specific (e.g. ECC), while retaining the NAND protocol infrastructure. The ONFI interface does not consider memory structures that combine NAND memory arrays with NOR memory arrays on a single substrate.

SUMMARY OF THE INVENTION

An object of this invention is to provide a nonvolatile memory device having multiple independent nonvolatile memory arrays.

Further, another object of this invention is to provide a nonvolatile memory device wherein multiple independent nonvolatile memory arrays function concurrently for parallel reading and writing of the multiple independent nonvolatile memory arrays.

Still further, another object of this invention is to provide a nonvolatile memory device with a parallel interface for communication of commands, address, device status, and data between a master external control device and a slave nonvolatile memory device connected to the parallel interface.

Further, another object of this invention is to provide a nonvolatile memory device in which commands from an external control device interrupts a process and performs a second process and resumes the process at the original location within the nonvolatile memory device.

Still further, another object of this invention is to provide a nonvolatile memory device in which commands from an external control device interrupts a process and restarts the process at another location within the nonvolatile memory device.

Still further, another object of this invention is to provide a nonvolatile memory device in which commands from an external control device provides a decoded address location within the nonvolatile memory device at which a process is to be executed.

To accomplish at least one of these objects, an embodiment of a nonvolatile memory device includes multiple nonvolatile memory arrays. Each of the multiple nonvolatile memory arrays has independent address, control, status, and data control circuitry. Further, in various embodiments, each of the multiple nonvolatile memory arrays is a NAND array, NOR array, or other type of nonvolatile memory array. The NOR array may be a NAND like dual charge retaining transistor NOR flash nonvolatile memory array. The nonvolatile memory device further includes a parallel communication interface circuit for communication with an external control device.

The parallel communication interface circuit receives a master clock signal, multiple control signals, and a parallel data bus. The interface communication circuit uses the master clock signal for capturing of the control signals. The interface communication circuit decodes the control signals to activate the nonvolatile memory device and to determine the commands to be executed by the nonvolatile memory device. The decoded commands are transmitted to the control circuitry within the multiple nonvolatile memory arrays for execution of the commands. The interface communication circuit further receives the address and data signals from the parallel data bus for distribution to selected locations within the nonvolatile memory arrays.

The nonvolatile memory device has an address decoder circuit connected to the parallel data bus to receive the address signal designating the location of the data to be read or written to selected locations within the nonvolatile memory arrays. The nonvolatile memory device has a data multiplexer connected to the nonvolatile memory arrays for receiving data signals read from selected locations of the nonvolatile memory array. The data multiplexer serializes the data signals that are concurrently read from selected nonvolatile memory arrays and transmits the data signals on the parallel bus.

In some embodiments, the control signals received by the interface parallel communication interface circuit commands that a read operation at one location be interrupted and the read operation is relocated to a second address. The second address is decoded by the address decoder and the data of the second location is transferred subsequent to the data from the first location.

In various embodiments, the control signals received by the parallel communication interface circuit commands that a read operation be executed wherein two separate addresses are received and decoded separately to define a row address and a column address within one of the multiple nonvolatile memory arrays. One address of the two separate addresses defining the row address is transferred directly to a row latching drive and the other address of the two separate addresses defining the column address is transferred to a column latching driver of the selected one of the multiple nonvolatile memory arrays. The data located at the location designated by the two separate addresses is transferred to the parallel data bus.

In various embodiments, each of the nonvolatile memory arrays is divided into a plurality of sub-arrays that may be independently and concurrently read from or written to. A write operation for the multiple nonvolatile memory arrays includes a program operation and an erase operation. In some embodiments, the sub-arrays may be receiving data signals from the parallel data bus while programming data to selected memory cells of the nonvolatile memory sub-array.

In various embodiments, the coding of the control signals define that some of the nonvolatile memory arrays are being read, others of the nonvolatile memory arrays are being erased and still others are being programmed.

In other embodiments, an electronic device has a host processing circuit in communication with a host master controller. The host master controller is communication with at least one slave nonvolatile memory device through a parallel communication interface circuit within the slave nonvolatile memory device. The host master controller provides commands, address, and writes data to the slave device and receives read data and device status from the slave device.

The slave nonvolatile memory device includes multiple nonvolatile memory arrays. Each of the multiple nonvolatile memory arrays has independent address, control, status, and data control circuitry. Further, in various embodiments, each of the multiple nonvolatile memory arrays is a NAND array, NOR array, or other type of nonvolatile memory array. The NOR array may be a NAND like dual charge retaining transistor NOR flash nonvolatile memory array.

The interface communication circuit receives a master clock signal, a chip enable signal, and a parallel data bus. The interface communication circuit uses the master clock signal for capturing of the control signals received from the parallel data bus. The interface communication circuit decodes the control signals to activate the nonvolatile memory device and to determine the commands to be executed by the nonvolatile memory device. The decoded commands are transmitted to the control circuitry within the multiple nonvolatile memory arrays for execution of the commands. The interface communication circuit further receives the data signals from the parallel data bus for distribution to selected locations within the nonvolatile memory arrays.

The slave nonvolatile memory device has an address decoder circuit connected to the parallel data bus to receive the address signal designating the location of the data to be read or written to selected locations within the nonvolatile memory arrays. The slave nonvolatile memory device has a data multiplexer connected to the nonvolatile memory arrays for receiving data signals read from selected locations of the nonvolatile memory array. The data multiplexer serializes the data signals that are concurrently read from selected nonvolatile memory arrays and transmits the data signals on the parallel data bus.

In various embodiments, each of the nonvolatile memory arrays is divided into a plurality of sub-arrays that may be independently and concurrently read from or written to. A write operation for the multiple nonvolatile memory arrays includes a program operation and an erase operation. In some embodiments, the sub-arrays may be receiving data signals from the parallel data bus while programming data to selected memory cells of the nonvolatile memory sub-array.

In various embodiments, the coding of the control signals define that some of the nonvolatile memory arrays are being read, others of the nonvolatile memory arrays are being erased and still others are being programmed.

In still other embodiments, a method for communicating commands, address, and write data to slave nonvolatile memory devices and for receiving read data and device status from the slave nonvolatile memory devices. The slave nonvolatile memory devices are provided such that each of the multiple nonvolatile memory arrays has independent address, control, status, and data control circuitry. Further, in various embodiments, each of the multiple nonvolatile memory arrays is a NAND array, NOR array, or other type of nonvolatile memory array. The NOR array may be a NAND like dual charge retaining transistor NOR flash nonvolatile memory array.

A master clock signal, a chip enable signal, and a parallel data signal are received by the slave nonvolatile memory device from a parallel data bus. The master clock signal captures the control signals received from the parallel data bus. The control signals are decoded to activate the nonvolatile memory device and to determine the commands to be executed by the nonvolatile memory device. The decoded commands are transmitted for execution by the multiple nonvolatile memory arrays. The data signals are received from the parallel data bus for distribution to selected locations within the nonvolatile memory arrays identified by the address signals.

The address signal designating the location of the data to be read or written to selected locations within the nonvolatile memory arrays are read from the parallel data bus is received and decoded. Data signals concurrently read from selected locations of the nonvolatile memory array are serialized and transmitted the data signals on the parallel data bus.

In some embodiments, the control signals indicate that a read operation at one location is to be interrupted and the read operation is to be relocated to a second address. The second address is decoded and the data of the second location is transferred subsequent to the data from the first location.

In various embodiments, the control signals indicates that a read operation is to be executed wherein two separate addresses are received and decoded separately to define a row address and a column address within one of the multiple nonvolatile memory arrays. One address of the two separate addresses defining the row address is transferred directly to a row latching driver and the other address of the two separate addresses defining the column address is transferred to a column latching driver of the selected one of the multiple nonvolatile memory arrays. The data located at the location designated by the two separate addresses is transferred to the parallel data bus.

In various embodiments, each of the nonvolatile memory arrays is divided into a plurality of sub-arrays that may be independently and concurrently read from or written to. A write operation for the multiple nonvolatile memory arrays includes a program operation and an erase operation. In some embodiments, the sub-arrays may be receiving data signals from the parallel data bus while programming data to selected memory cells of the nonvolatile memory sub-array.

In various embodiments, the coding of the control signals define that some of the nonvolatile memory arrays are being read, others of the nonvolatile memory arrays are being erased and still others are being programmed.

BRIEF DESCRIPTION OF THE DRAWINGS

FIG. 1b is a table describing the terminals of the parallel communication interface of the nonvolatile memory device embodying the principles of this invention.

FIG. 5b is a timing diagram illustrating the waveforms of the parallel interface for a read operation of NAND or NOR nonvolatile memory arrays of a nonvolatile memory device embodying the principles of this invention, where the data is read on the two edges of the clocking signal.

FIG. 8 is a timing diagram illustrating the waveforms of the parallel interface for an erase operation of NAND or NOR nonvolatile memory arrays of a nonvolatile memory device embodying the principles of this invention.

FIG. 9 is a timing diagram illustrating the waveforms of the parallel interface for a program operation of NAND or NOR nonvolatile memory arrays of a nonvolatile memory device embodying the principles of this invention.

FIG. 11b is a timing diagram illustrating the waveforms of the parallel interface for a read resume operation of NAND or NOR nonvolatile memory arrays of a nonvolatile memory device embodying the principles of this invention.

FIGS. 14a, 14b, and 14c are a table of the operational modes of the nonvolatile memory device embodying the principles of this invention.

DETAILED DESCRIPTION OF THE INVENTION

Figure 1A:
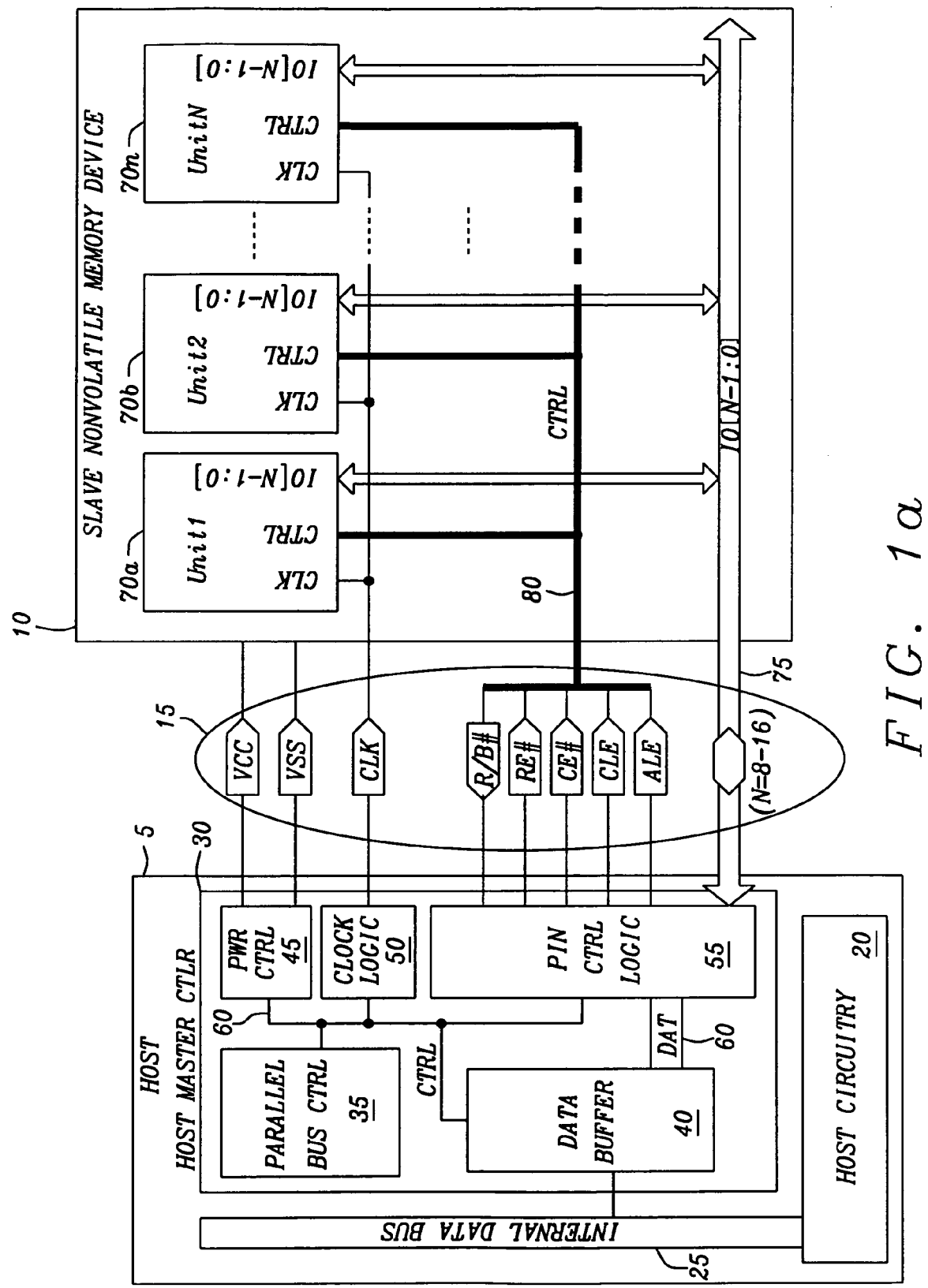
FIG. 1a is a block diagram illustrating an electronic device in communication with at least one slave nonvolatile memory device through a parallel communication interface with the slave nonvolatile memory device embodying the principles of this invention.

A number patents and patent application publications for hybrid NAND and NOR nonvolatile memory arrays that are integrated in one die with a parallel interface are found in the art and are illustrated by the following: U.S. Pat. No. 7,120,064, U.S. Pat. No. 7,102,929, U.S. Pat. No. 7,372,736, U.S. Patent Application Publication 20080096327, U.S. Pat. No. 7,064,978, U.S. Pat. No. 7,324,384, U.S. Pat. No. 6,687,154, U.S. Pat. No. 7,283,401, U.S. Patent Application Publication 20060176738, U.S. Pat. No. 7,110,302, U.S. Patent Application Publication 20080247230, U.S. Pat. No. 7,075,826, U.S. Pat. No. 7,369,438, U.S. Pat. No. 6,862,223, U.S. Pat. No. 7,289,366 all to Lee, et al. and assigned to the same assignee as the present invention The disadvantage of parallel interfaces is the increase in the number of external pins of the die or package. The number of Input/Output pins for the die or page directly impacts the size and cost of the die and package. The number Input/Output pins would not be a constant. The doubling of the density of the nonvolatile memory causes an increase in the number of pins for the die or package. This makes the circuit design difficult and is not forward and backward compatible with different nonvolatile memory densities.

In various embodiments, a parallel nonvolatile memory interface bus provides for communication of commands, address, and write data to a slave nonvolatile memory device and receives read data and device status from the slave nonvolatile memory device to a master host device. The slave nonvolatile memory device has multiple nonvolatile memory arrays each with independent address, control, status, and data control circuitry. Further, in various embodiments, each of the multiple nonvolatile memory arrays is a NAND array, NOR array, or other type of nonvolatile memory array. The NOR array may be a NAND like dual charge retaining transistor NOR flash nonvolatile memory array.

The parallel nonvolatile memory interface bus includes connections that provide a master clock signal, a chip enable signal, and a parallel data signal to the slave nonvolatile memory device from a parallel data bus transmitted from the master host device. The master clock signal captures the control signals received from the parallel data bus. The control signals are decoded to activate the nonvolatile memory device and to determine the commands to be executed by the nonvolatile memory device. The decoded commands are transmitted for execution by the multiple nonvolatile memory arrays. The data signals are received from the parallel data bus for distribution to selected locations within the nonvolatile memory arrays.

The address signal designates the location of the data to be read or written to selected locations within the nonvolatile memory arrays from the parallel data bus is received and decoded. Data signals concurrently read from selected locations of the nonvolatile memory array are transmitted on the parallel data bus.

In some embodiments, the control signals command that a read operation at one location is to be interrupted and the read operation is to be relocated to a second address. The second address is decoded and the data of the second location is transferred subsequent to the data from the first location.

In various embodiments, the control signals command that a read operation be executed wherein two separate addresses are received and decoded separately to define a row address and a column address within one of the multiple nonvolatile memory arrays. One address of the two separate addresses defining the row address is transferred directly to a row latching drive and the other address of the two separate addresses defining the column address is transferred to a column latching driver of the selected one of the multiple nonvolatile memory arrays. The data located at the location designated by the two separate addresses is transferred to the parallel data bus.

In various embodiments, each of the nonvolatile memory arrays is divided into a plurality of sub-arrays that may be independently and concurrently read from or written to. A write operation for the multiple nonvolatile memory arrays includes a program operation and an erase operation. In some embodiments, the sub-arrays may be receiving data signals from the parallel bus while programming data to selected memory cells of the nonvolatile memory sub-array.

In various embodiments, the coding of the control signals define that some of the nonvolatile memory arrays are being read, other of the nonvolatile memory arrays are being written to and still other are being programmed.

FIG. 1a is a block diagram illustrating a host electronic device 5 in communication with at least one slave nonvolatile memory device 10 through a parallel communication interface 15 with the slave nonvolatile memory device 10. The host electronic device 5 includes host circuitry 20 that may be a microprocessor, a microcontroller, digital signal processor, or other digital computation device. The host circuitry 20 is connected to an internal data bus 25 that provides the necessary signals for the communication of control signals, address signals, and data signals for the host circuitry 20 to communicate with peripheral devices (not shown) attached such that the host circuitry can execute its designed functions.

FIG. 1b is a table describing the terminals of the parallel communication interface 15 of the nonvolatile memory device 10. Referring to FIGS. 1a and 1b, the parallel communication interface 15 provides the necessary power connections VCC and VSS, timing signals CLK, control signals 80, command, address, and data signals 75 such that the host electronic device 5 and the nonvolatile memory device 10 are able to control transfer of data between the host electronic device 5 and the nonvolatile memory device 10. The parallel communication interface 15 further provides the necessary timing signals CLK, control signals 80, command, address, and data signals 75 for the nonvolatile memory device 10 to write data to the selected multiple nonvolatile memory units 70a, 70b, ..., 70n and read the data from the multiple nonvolatile memory units 70a, 70b, ..., 70n. In some embodiments, the parallel communication interface 15 complies with the ONFI specification. While the ONFI specification has command and control signals that are not employed, those signals enable the nonvolatile memory device 10 to function essentially according to the ONFI specification.

The clock signal CLK is an output of the host electronic device 5 and provides the timing for the parallel interface. Commands, addresses, or input data transmitted on the parallel interface Input/Output bus 75 are latched on the rising edge of the clock input by the nonvolatile memory device 10. The output data is shifted out on the parallel interface Input/Output bus 75 at the falling edge of the clock signal CLK. During a special read mode, the output data is shifted out on parallel interface Input/Output bus 75 at the falling and rising edge of the clock signal CLK.

The control signals 80 include the Ready/Busy signal R/B#, the Read Enable signal RE#, the chip enable signal CE#, Command Latch Enable signal CLE, and the Address Latch Enable signal ALE. The Ready/Busy signal R/B# is an output signal from the NAND memory array elements 100 or NOR memory array elements 105 indicates the target status. When low, the signal indicates that one or more NAND memory array elements 100 or NOR memory array elements s105 write operations are in progress. This signal is an open drain output and requires an external pull-up. The Read Enable signal RE# enables the data output being read from the NAND memory array elements 100 or NOR memory array elements 105 of the nonvolatile memory device 10.

A chip enable signal CE# is an input to the nonvolatile memory device 10 that activates the nonvolatile memory device 10 for an operation. The nonvolatile memory device 10 is enabled by a transition of the chip enable signal CE# from the high state (logical "1") to the low state (logical "0"). The chip enable signal CE# must remain low for the duration of any command sequence. In the case of Write operations (erase or program), the command sequence consists of the command, address, and any data input to be written. The command operations are terminated when the chip enable signal CE# transitions from the low state (logical "0") to the high state (logical "1").

The parallel communication interface 15 has power supply terminals for the power supply voltage source VCC and the power supply reference level VSS. The power supply voltage source VCC terminals are connections for the nonvolatile memory device 10 to the power supply. The power supply reference level VSS terminals are the connections to the ground reference voltage level.

The Command Latch Enable signal CLE is used by the host electronic device 5 to indicate that the command signals are present on the parallel communication interface 15. The Address Latch Enable signal ALE is used by the host electronic device 5 to indicate that the command signals are present on the parallel communication interface 15.

The parallel interface Input/Output bus 75 is a bi-directional interface transfer commands, addresses, or data into the nonvolatile memory device 10 data out of the nonvolatile memory device 10. Input command signals, address signals, and data signals are latched on the rising edge of the clock signal CLK. Output Data is shifted out on the falling edge of the parallel clock, except during the special read mode, where the output data is shifted out on the falling and rising edge of the clock signal CLK. Each of the multiple nonvolatile memory units 70a, 70b, ..., 70n communicates with the host electronic device 5 through a separate set of control signals 80. There is a single parallel interface Input/Output bus 75 for all the multiple nonvolatile memory units 70a, 70b, ..., 70n. Single array of the multiple nonvolatile memory units 70a, 70b, ..., 70n receives or transmits data on parallel interface Input/Output bus 75 by multiplexing the access to the parallel interface Input/Output bus 75. During the command input phase, only one array of the multiple nonvolatile memory units 70a, 70b, ..., 70n will be activated to receive the data from the parallel interface Input/Output bus 75 by the command and address code.

A host master controller 30 is connected to the internal data bus 25 to communicate with the host circuitry 20. The host master controller 30 receives the necessary command signals, address signals, and data signals from the host circuitry 20 and controls the generation of the necessary timing, command, control, and data signals that comply with the protocol of the parallel communication interface 15. The parallel bus controller 35 interprets the command, control, and timing signals received from the internal data bus 25 to generate the necessary control signals 60. The data buffer 40 receives the data to be transmitted from the host circuitry 20 to the slave nonvolatile memory device 10 or from the slave nonvolatile memory device 10 to the host circuitry 20. The power control circuitry 45 is connected to receive the control signals 60 from the parallel bus controller 35 provide and monitor the power supply voltage level VCC and the power supply reference level VSS.

The clock logic 50 is connected to receive the control signals 60 from the parallel bus controller 35 to control the transmission of the clock signal CLK on the interface bus. The clock signal CLK has a frequency, in some embodiments, of approximately 80 Mhz. The pin control logic circuit 55 is connected to the data bus 65 to receive the data signals from or transfer data signals to the data buffer 40. The pin control logic circuit 55 is further connected to the control signals 60 to receive the necessary command and control signals from the parallel bus controller 35 to format the command, control, and data signals for transmission to the parallel interface Input/Output bus 75 for transfer to the slave nonvolatile memory device 10. The pin control logic circuit 55 receives data read from the slave nonvolatile memory device 10, formats the data to protocol of the host circuitry 20 and stores it to the data buffer 40. The pin control logic circuit 55 generates the chip enable signal CE# for transfer to the slave nonvolatile memory device 10 to inform the slave nonvolatile memory device 10 that the command, control, and data signal are active and should be received and processed.

Figure 2:
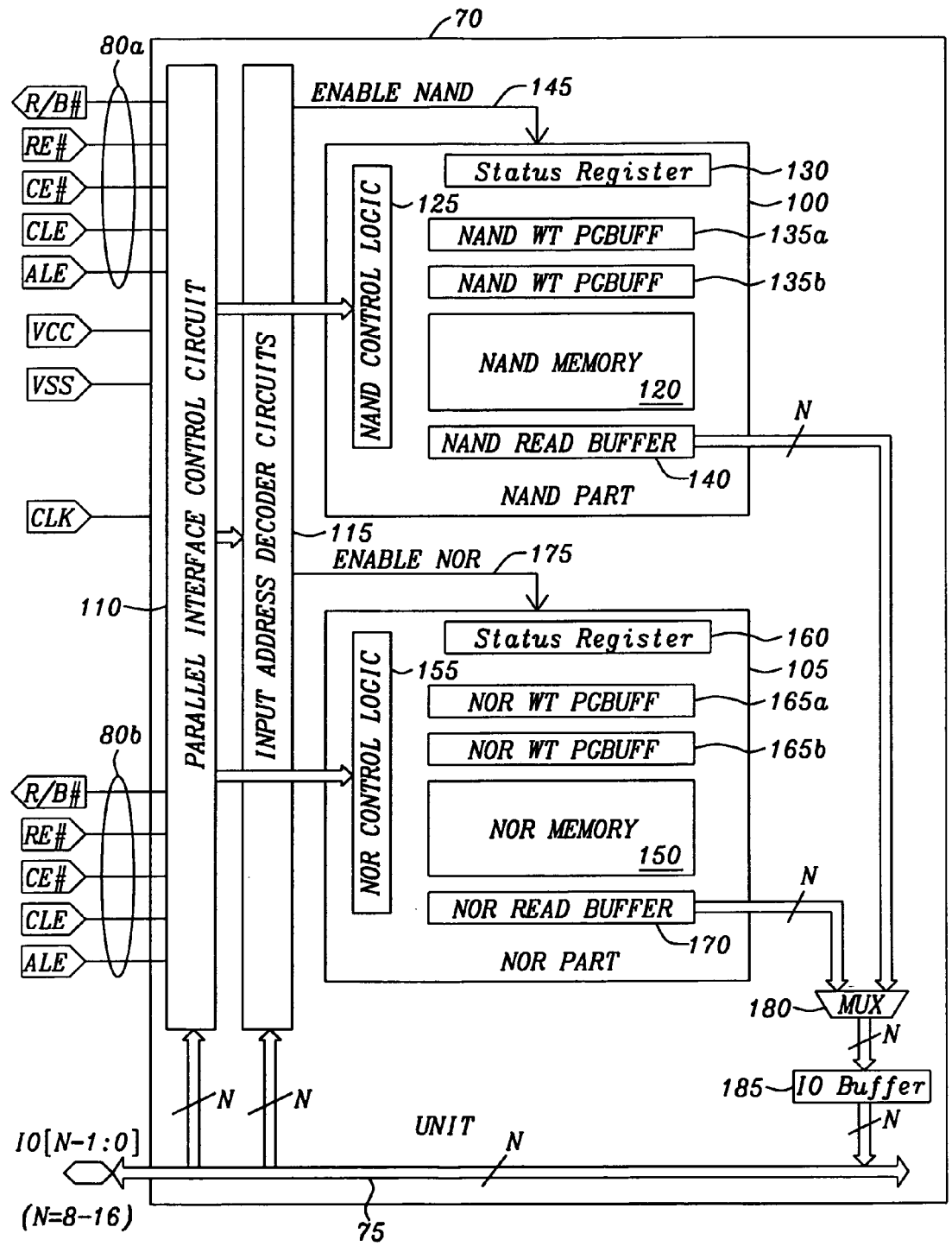
FIG. 2 is a block diagram illustrating a nonvolatile memory device communicating with an external device through a parallel communication interface embodying the principles of this invention.

The slave nonvolatile memory device 10 includes multiple nonvolatile memory units 70a, 70b, ..., 70n. Each of the multiple nonvolatile memory units 70a, 70b, ..., 70n is connected to receive the power supply voltage level VCC and the power supply reference level VSS, the clock signal CLK, the control signals 80, and the Input/Output bus 75 from the parallel communication interface 15. FIG. 2 is a block diagram illustrating a slave nonvolatile memory device 10 communicating with the external control device of the host 5 through the parallel communication interface 15. Referring to FIG. 2, the nonvolatile memory unit 70 has at least two nonvolatile memory array elements—a NAND memory 100 and a NOR memory array element 105 for retaining the data transferred from the host electronic device 5 of FIG. 1a. The power supply voltage level VCC and the power supply reference level VSS are transferred to the nonvolatile memory unit 70. Each NAND memory 100 receives a set of the control signals 80a and each NOR memory array element 105 receives a set of the control signals 80b. The control signals 80a and 80b and the clock signal CLK are applied to the parallel interface control circuit 110. The control signals 80a and 80b include the Ready/Busy signal R/B#, the Read Enable signal RE#, the chip enable signal CE#, Command Latch Enable signal CLE, and the Address Latch Enable signal ALE.

The parallel interface control circuit 110 is connected to parallel interface Input/Output bus 75 to receive the command, address, and data. The command and address are decoded for transfer to the NAND memory array element 100 and a NOR memory array element 105 for reading and writing data. The chip enable signal CE# provides signal that an operation is beginning. The Command Latch Enable signal CLE provides the trigger for beginning of the capture of the command signals by the parallel interface Input/Output bus 75. The Address Latch Enable signal ALE provides the trigger for beginning of the capture of the address signals by the parallel interface Input/Output bus 75. The data from the parallel interface Input/Output bus 75 captured by the parallel interface control circuit 110 at the rising edge and falling edge of the clock signal CLK.

The control signals 80a and 80b and the clock signal CLK are further transferred to the input address decoder circuit 115. The input address decoder circuit 115 is similarly connected to the parallel interface Input/Output bus 75 and receives the command signals at the activation of the Command Latch Enable signal CLE and address at the activation of the Address Latch Enable signal ALE. The input address decoder circuit 115 decodes the address and determines which of the NAND memory array element 100 and a NOR memory array element 105 is to be selected for reading and/or writing of data. Upon selection of desired NAND memory array element 100 and/or a NOR memory array element 105, the input address decoder circuit 115 activates the NAND element enable signal 145 and/or the NOR element enable signal 175 to alert the NAND memory array element 100 and/or a NOR memory array element 105 that data is to be read and/or written.

The NAND memory array element 100 has a NAND logic control circuit 125 that receives the command, address and data from the parallel interface control circuit 110. The NAND logic control circuit 125 further decodes the address and based on the command establishes the necessary read, program, or erase biasing voltages that are applied to the NAND memory array 120. The data is written from the NAND logic control circuit 125 to one of the NAND write page buffers 135a or 135b and from the page buffers the data is then programmed to the NAND memory array 120. The dual write page buffers 135a or 135b enables execution of a data write to one of the write page buffers 135a or 135b while the data is programmed from the other write page buffers 135a or 135b. The concurrent write while program operation accelerates the overall performance of the writing of data to the NAND memory array element 100. For a read operation, the NAND logic control circuit 125 provides a read address to the NAND memory array 120 and the data is transferred from the addressed location to the NAND read page buffer 140. From the NAND read page buffer 140, the data is transferred through the multiplexer 180 to the Input/Output buffer 185 to the parallel Input/Output bus 75.

The NOR memory array element 105 has a NOR logic control circuit 155 that receives the command, address and data from the parallel interface control circuit 110. The NOR logic control circuit 155 further decodes the address and based on the command establishes the necessary read, program, or erase biasing voltages that are applied to the NOR memory array 150. The data is written from the NOR logic control circuit 155 to one of the NOR write page buffers 165a or 165b and from the page buffers the data is then programmed to the NOR memory array 150. The dual write page buffers 165a or 165b enables execution of a data write to one of the write page buffers 165a or 165b while the data is programmed from the other write page buffers 165a or 165b. The concurrent write while program operation accelerates the overall performance of the writing of data to the NOR memory array element 105. For a read operation, the NOR logic control circuit 155 provides a read address to the NOR memory array 150 and the data is transferred from the addressed location to the NOR read page buffer 170. From the NOR read page buffer 170, the data is transferred through the multiplexer 180 to the Input/Output buffer 185 to the parallel Input/Output bus 75.

Figure 3A:
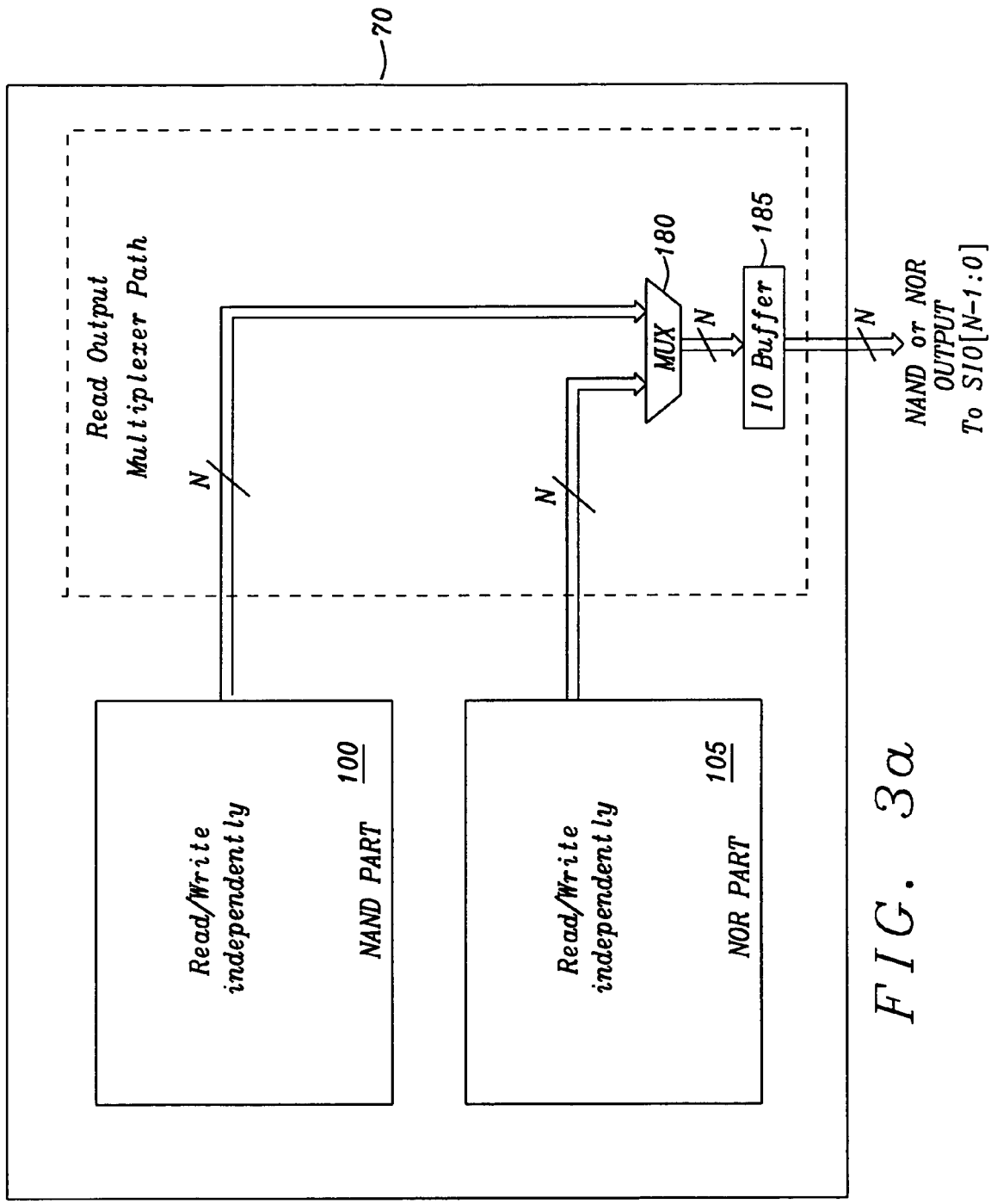
FIG. 3a is a block diagram of multiple independent nonvolatile memory arrays transferring data through a multiplexer to the parallel communication interface of FIG. 2.

FIG. 3a is a block diagram of multiple independent nonvolatile memory array elements 100 and 105 transferring data through the multiplexer 180 to the Input/Output bus 75 of FIG. 2. Referring to FIG. 3a the NAND memory array element 100 and a NOR memory array element 105 are each executing separate read and/or write operations within each. If the operations are to be read operations, the NAND memory array element 100 and a NOR memory array element 105 each transfer their data output signals to the multiplexer 180. The parallel interface control circuit 110 provides the necessary select control signals SEL to select appropriate output data signals from the NAND memory array element 100 or a NOR memory array element 105 for transfer to the Input/Output bus 75.

Figures 3B, 3C:
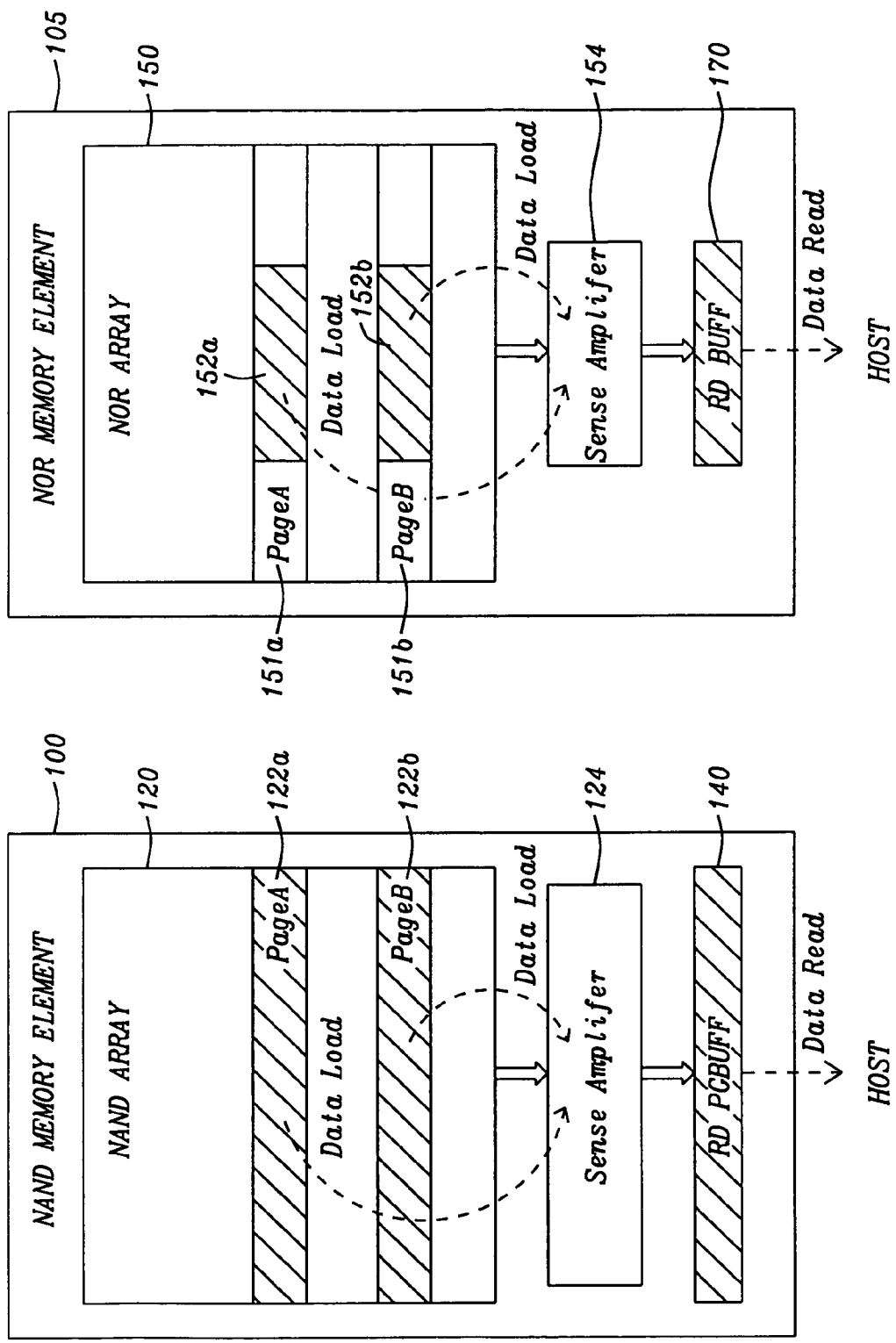
FIG. 3b is a block diagram illustrating a simultaneous read-while-loading of a NAND nonvolatile memory array embodying the principles of this invention.
FIG. 3c is a block diagram illustrating a simultaneous read-while-loading of a NOR nonvolatile memory array embodying the principles of this invention.

FIG. 3b is a block diagram illustrating a simultaneous read-while-loading of a NAND nonvolatile memory array element 100. The simultaneous read-while-loading operation accelerates the read performance of the NAND nonvolatile memory array element 100 enabling data to be read out to the host electronic device 5 from the NAND read page buffer 140 while the data is being loaded from the NAND memory array 120 and determined by the sense amplifier 124. Once the data is determined by the sense amplifier 124, it is transferred to the NAND read page buffer 140 in parallel and instantly. There are multiple individual sense amplifier circuits within the sense amplifier 124 for the NAND memory array 120 such that the data from a selected page 122a is read in parallel. Upon completion of the parallel sensing by the sense amplifier 124, the data is then transferred in parallel to the NAND read page buffer 140 and read out from the NAND read page buffer 140 to the parallel interface Input/Output bus 75 and thus to the host electronic device 5. Concurrently, the next page 122b is selected and the data is sensed by the sense amplifier 124. Upon completion of the sensing by the sense amplifier 124, the data of the page 122b is then transferred to the NAND read page buffer 140 and read out from the NAND read page buffer 140 to the parallel interface Input/Output bus 75 and thus to the host electronic device 5. This structure allows for simultaneous sensing of data from a page 122b by the sense amplifier 124 and transfer of the data from a previously sensed page 122a from the NAND read page buffer 140 to the parallel interface Input/Output bus 75 and thus to the host electronic device 5.

FIG. 3c is a block diagram illustrating a simultaneous read-while-loading of a NOR nonvolatile memory array element 105. The simultaneous read-while-loading operation accelerates the read performance of the NOR nonvolatile memory array element 105 enabling data to be read out to the host electronic device 5 from the NOR read buffer 170 while the data is being loaded from the NOR memory array 150 and determined by the sense amplifier 154. Once the data is determined by the sense amplifier 154, it is transferred to the NOR read buffer 170 in parallel and instantly. There are multiple individual sense amplifier circuits within the sense amplifier 154 for the NOR memory array 150 such that the data from a selected byte 152a within a page 151a is read in parallel. Upon completion of the parallel sensing by the sense amplifier 154, the data is then transferred in parallel to the NOR read buffer 170. Concurrently, the next byte 152b from the page 151b is selected and the data is sensed by the sense amplifier 154. Upon completion of the sensing by the sense amplifier 154, the data of the byte 152b is then transferred to the NOR read page buffer 170 and read out from the NOR read page buffer 170 to the parallel interface Input/Output bus 75 and thus to the host electronic device 5. This structure allows for simultaneous sensing of data from a byte 152b by the sense amplifier 154 and transfer of the data from a previously sensed page 152a from the NOR read page buffer 170 to the parallel interface Input/Output bus 75 and thus to the host electronic device 5.

Figure 4B:
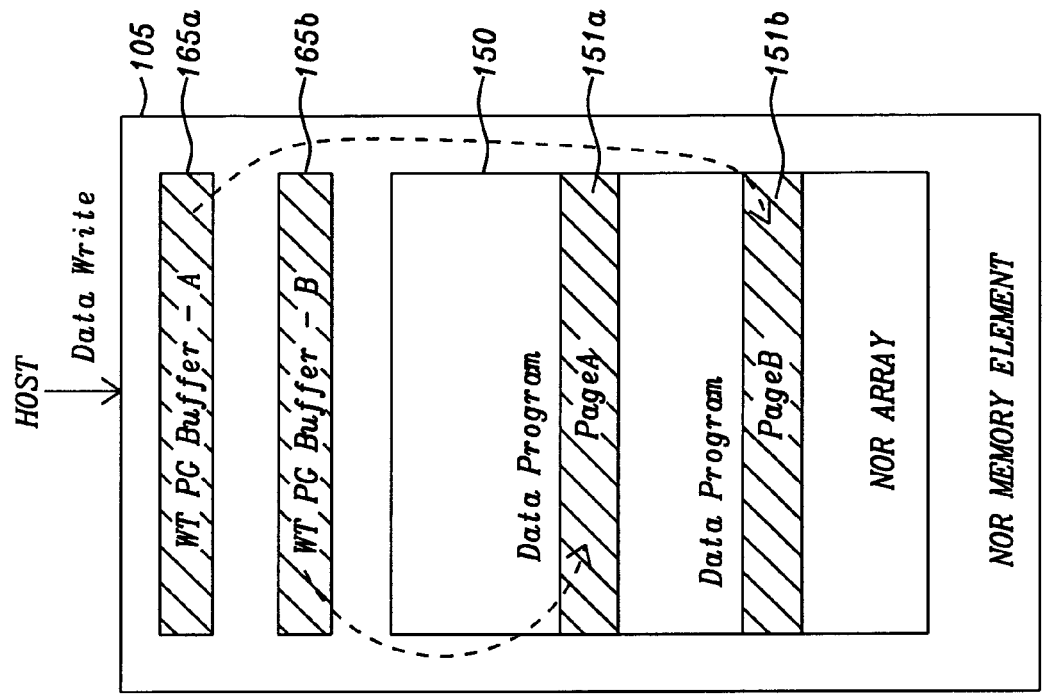
FIG. 4b is a block diagram illustrating a simultaneous write-while-programming of a NOR nonvolatile memory array embodying the principles of this invention.
Figure 4A:
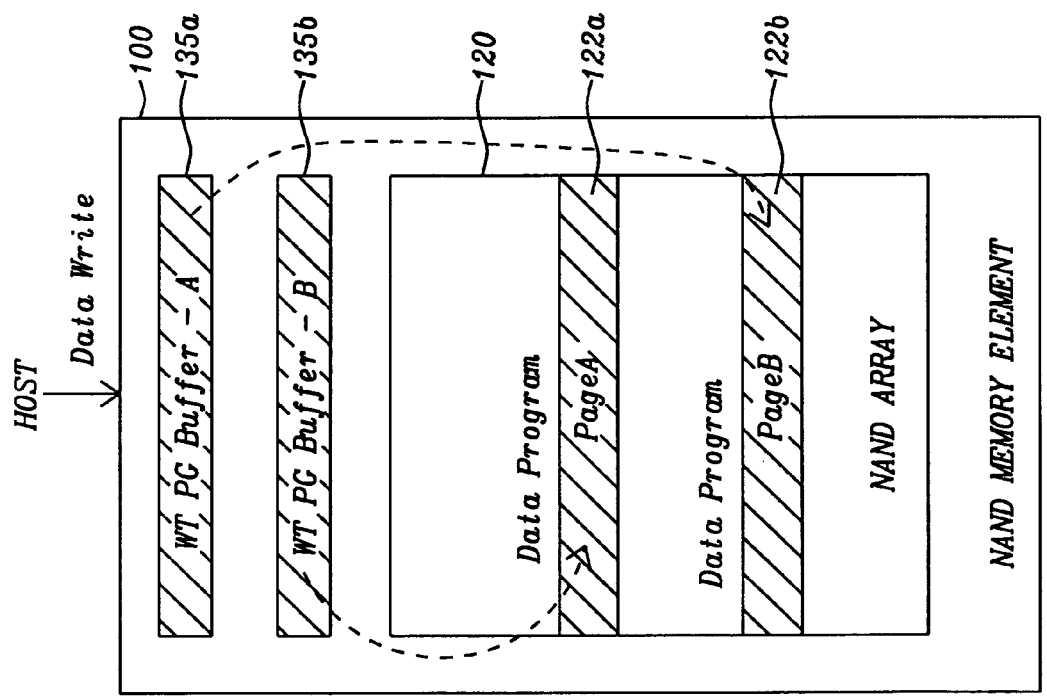
FIG. 4a is a block diagram illustrating a simultaneous write-while-programming of a NAND nonvolatile memory array embodying the principles of this invention.

FIG. 4a is a block diagram illustrating a simultaneous write-while-programming of a NAND nonvolatile memory array element 100. The simultaneous write-while-programming operation accelerates the write performance of the NAND nonvolatile memory array element 100 enabling data to be written from the host electronic device 5 to the NAND write page buffer 135a while the data is being programmed to the selected page 122a of the NAND memory array 120 from the NAND write page buffer 135b. When the data is successfully programmed to the selected page 122a, the data is programmed from the NAND write page buffer 135b and new data is written from the host electronic device 5 to the NAND write page buffer 135a. This switching of the writing of data from the host electronic device 5 to one of the NAND write page buffer 135a or 135b and the programming of a selected page 122a, . . . , 122b from the other of the NAND write page buffer 135a or 135b allows the acceleration of the write performance for the NAND nonvolatile memory array element 100.

FIG. 4b is a block diagram illustrating a simultaneous write-while-programming of a NOR nonvolatile memory array element 100. The simultaneous write-while-programming operation accelerates the write performance of the NOR nonvolatile memory array element 100 enabling data to be written from the host electronic device 5 to the NOR write page buffer 165a while the data is being programmed to the selected page 151a of the NOR memory array 150 from the NOR write page buffer 165b. When the data is successfully programmed to the selected page 151a, the data is programmed from the NOR write page buffer 165b and new data is written from the host electronic device 5 to the NOR write page buffer 165a. This switching of the writing of data from the host electronic device 5 to one of the NOR write page buffer 165a or 165b and the programming of a selected page 151a, . . . , 151b from the other of the NOR write page buffer 165a or 165b allows the acceleration of the write performance for the NOR nonvolatile memory array element 100.

Returning to FIG. 2, in some embodiments of nonvolatile memory unit, the at least two nonvolatile memory array elements—the NAND memory array element 100 and the NOR memory array element 105 are divided into at least two independent sub-arrays. The independent sub-arrays may be written to (programmed or erased) and read from. The control, address, and data signals are transferred from the NAND logic control circuit 125 to the NAND nonvolatile memory array element 100 and to the NOR logic control circuit 155 for the NOR memory array element 105 such that the individual NAND nonvolatile memory array element 100 and the NOR memory array element 105 may be operating concurrently. Similarly, the control, address, and data signals are transferred from the NAND logic control circuit 125 to the NAND nonvolatile memory array element 100 and to the NOR logic control circuit 155 for the NOR memory array element 105 such that the individual sub-arrays of the NAND memory array elements 120 and individual sub-array elements of the NOR memory array 150 may be operating concurrently to perform simultaneous reading and writing.

Figure 4C:
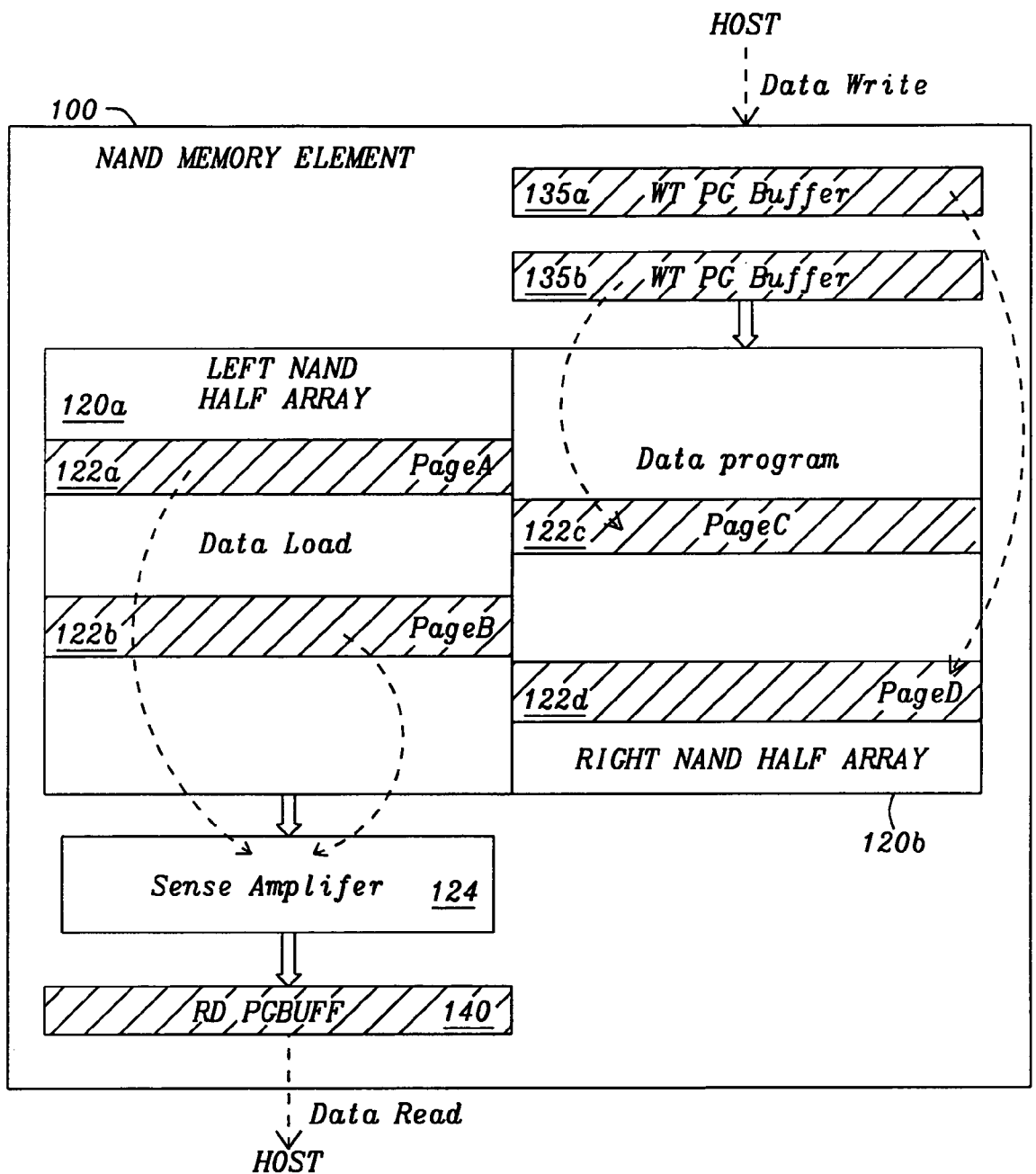
FIG. 4c is a block diagram illustrating a simultaneous read-while-loading of one sub-array and write-while-programming of a second sub-array of a NAND nonvolatile memory array embodying the principles of this invention.

FIG. 4c is a block diagram illustrating a simultaneous read-while-loading of one sub-array 120a and write-while-programming of a second sub-array 120b of a NAND nonvolatile memory array 100. In various embodiments, the data is loaded from a first page 122a of the NAND memory sub-array 120a and determined by the sense amplifier 124. Once the data is determined by the sense amplifier 124, it is transferred to the NAND read page buffer 140 in parallel and instantly. The multiple individual sense amplifier circuits within the sense amplifier 124 for the NAND memory sub-array 120a permit the data from the selected page 122a to be read in parallel. Upon completion of the parallel sensing by the sense amplifier 124, the data is then transferred in parallel to the NAND read page buffer 140 and read out from the NAND read page buffer 140 to the parallel interface Input/Output bus 75 and thus to the host electronic device 5. Simultaneously, the next page 122b is selected and the data is sensed by the sense amplifier 124. Upon completion of the sensing by the sense amplifier 124, the data of the page 122b is then transferred to the NAND read page buffer 140 and read out from the NAND read page buffer 140 to the parallel interface Input/Output bus 75 and thus to the host electronic device 5.

Concurrently, data to be written is transferred from the host electronic device 5 to the NAND write page buffer 135a. The data is programmed to the selected page 122d of the NAND memory array element 120b. Simultaneously data from the host electronic device 5 to the NAND write page buffer 135b. When the data is successfully programmed to the selected page 122a, the data is programmed from the NAND write page buffer 135b to the selected page 122c and new data is written from the host electronic device 5 to the NAND write page buffer 135a. The simultaneous read-while-loading of one sub-array 120a and write-while-programming of a second sub-array 120b of a NAND nonvolatile memory array 100 allows the acceleration of the write performance for the NAND nonvolatile memory array element 100. In various embodiments, the simultaneous read-while-loading and write-while-programming of a single of the first sub-array 120a or a second sub-array 120b of a NAND nonvolatile memory array 100 is prohibited.

Figure 4D:
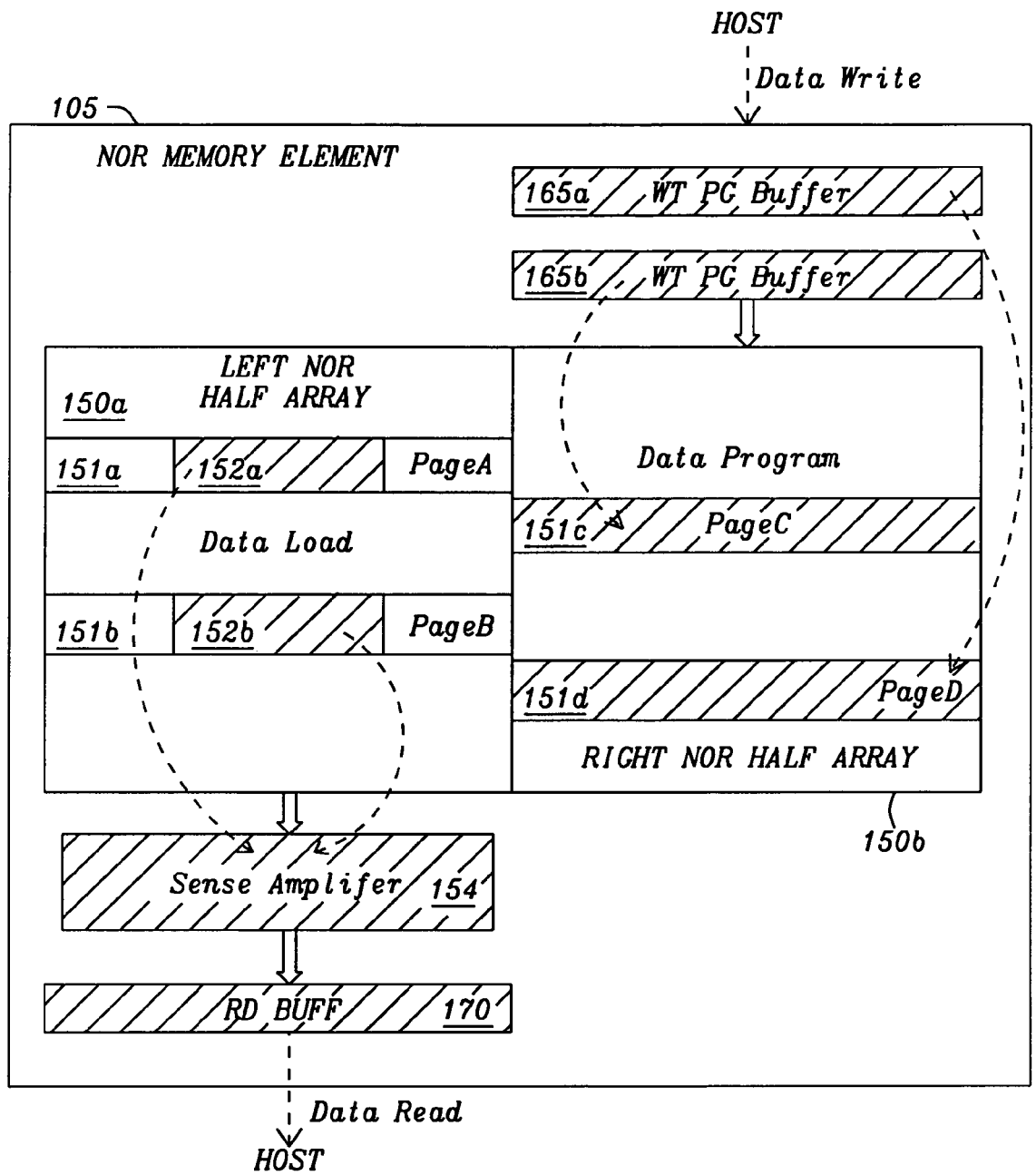
FIG. 4d is a block diagram illustrating a simultaneous read-while-loading of one sub-array and write-while-programming of a second sub-array of a NOR nonvolatile memory array embodying the principles of this invention.

FIG. 4d is a block diagram illustrating a simultaneous read-while-loading of one sub-array 150a and write-while-programming of a second sub-array 150b of a NOR nonvolatile memory array 105. In various embodiments, the data is loaded from a selected byte 152a of a first page 151a of the NOR memory sub-array 150a and determined by the sense amplifier 154. Once the data is determined by the sense amplifier 154, it is transferred to the NOR read buffer 170 in parallel and instantly. The multiple individual sense amplifier circuits within the sense amplifier 154 for the NOR memory sub-array 150a permit the data from the selected byte 152a of the page 151a to be read in parallel. Upon completion of the parallel sensing by the sense amplifier 154, the data is then transferred in parallel to the NOR read buffer 170 and read out from the NOR read buffer 170 to the parallel interface Input/Output bus 75 and thus to the host electronic device 5. Simultaneously, the next byte 152b of the page 151b is selected and the data is sensed by the sense amplifier 154. Upon completion of the sensing by the sense amplifier 154, the data of the selected byte 152b of the page 151b is then transferred to the NOR read buffer 170 and read out from the NOR read buffer 170 to the parallel interface Input/Output bus 75 and thus to the host electronic device 5.

Concurrently, data to be written is transferred from the host electronic device 5 to the NOR write page buffer 165a. The data is programmed to the selected page 151d of the NOR memory array 150b. Simultaneously data from the host electronic device 5 is transferred to the NOR write page buffer 165b. When the data is successfully programmed to the selected page 151a, the data is programmed from the NOR write page buffer 165b to the selected page 151c and new data is written from the host electronic device 5 to the NOR write page buffer 165a. The simultaneous read-while-loading of one sub-array 150a and write-while-programming of a second sub-array 150b of a NOR nonvolatile memory array 105 allows the acceleration of the write performance for the NOR nonvolatile memory array element 105. In various embodiments, the simultaneous read-while-loading and write-while-programming of a single of the first sub-array 150a or a second sub-array 150b of a NOR nonvolatile memory array 105 is prohibited.

The protocol of the parallel communication interface 15 provides the control signals 80 (Ready/Busy signal R/B#, the Read Enable signal RE#, chip enable CE#, Command Latch Enable signal CLE, and the Address Latch Enable signal ALE), the clock signal CLK, and the parallel interface Input/Output bus 75 as shown in FIG. 1. The number of terminal connections or pins for the parallel interface Input/Output bus 75 is determined by an integrated circuit package pin count or an integrated circuit chip Input/Output pad count. In some embodiments, the nonvolatile memory device 10 is packaged in a 16 pin package.

Figure 5A:
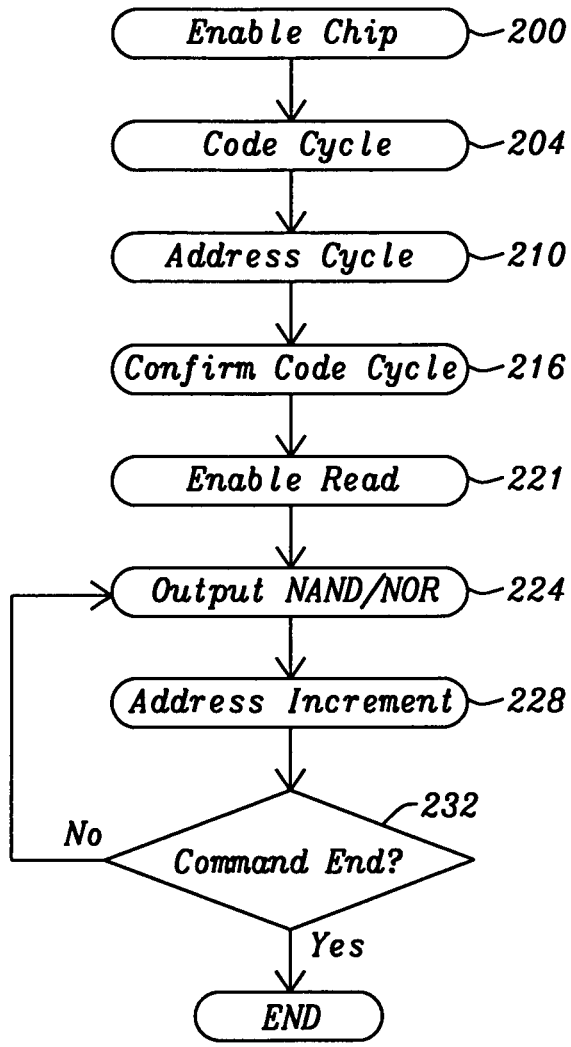
FIG. 5a is a flow chart of a method for a read operation of NAND or NOR nonvolatile memory arrays of a nonvolatile memory device embodying the principles of this invention.

FIG. 5a is a flow chart of a method for a read operation of the NAND nonvolatile memory array 100 and NOR nonvolatile memory array 105 of the nonvolatile memory device 70 of FIG. 2. FIG. 5b is a timing diagram illustrating the waveforms of the parallel interface for a read operation of NAND or NOR nonvolatile memory arrays of the nonvolatile memory device 70 of FIG. 2, where the data is read on the two edges of the clocking signal. Referring to FIGS. 5a and 5b, the protocol is structured such that a data transfer is initiated (Box 200) with the chip enable signal CE# being activated 202. A code cycle is executed (Box 204) with the activation 206 of the Command Latch Enable signal CLE. The command code 208 is received and decoded to determine that the operation is to be a Read of the NAND nonvolatile memory array elements 100 or NOR nonvolatile memory array elements 105. The address cycle is initiated (Box 210) with the activation 212. The address 214 is received and decoded. The address 214 includes a number of cycles such that the address will have a bit structure that is the product of the number of connections in the parallel interface Input/Output bus 75 and the number of cycles allocated to the address 214. The number of address bits being allocated based on the address space of the host electronic device 5. Further, the address space A[m:0] for the NAND array or NOR array is determined by the density of the NAND array or the NOR array. In various embodiments, the address 214 is a virtual address generated by the host electronic device 5 and the virtual address is translated by the address decoding mechanism of the input address decoder circuit 115 to the physical address of the NAND nonvolatile memory array elements 100 and the NOR memory array elements 105. In read operations, the address 214 is followed by a confirmation operation (Box 216) that is initiated 218 with the activation of the Command Latch Enable signal CLE. The read confirm command code 220 is received and decoded. It should be noted that the read confirm command code 220 forces the unselected NAND nonvolatile memory array elements 100 or NOR nonvolatile memory array elements 105 within the selected multiple nonvolatile memory units 70a, 70b, . . . , 70n and the unselected multiple nonvolatile memory units 70a, 70b, . . . , 70n to deactivate their connections to the parallel interface Input/Output bus 75. The Read Enable signal RE# is activated 223 to enable the reading of the data (Box 221). The first addressed data 222a is available for reading (Box 224) by being transferred to the parallel interface Input/Output bus 75. The addressed data 207 again occupies a number of cycles such that the quantity of data 207 accessed is again the product of the number of cycles and the number of connections of the parallel interface Input/Output bus 75. An address pointer counter (not shown) within the parallel interface control circuit 110 contains the address pointer and is incremented to access the next data segment 222a, 222b, . . . , 222n of the output data 226. The address pointer counter is incremented (Box 228) and the chip enable signal CE# is examined (Box 232) to determine if the chip enable signal CE# has been deactivated 230. If the chip enable signal CE# has not been deactivated, the next data segment 222b is transferred (Box 224) to the parallel interface Input/Output bus 75. The address pointer counter is incremented (Box 228) again and the chip enable signal CE# is examined (Box 232) to determine if the chip enable signal CE# has been deactivated 230. When the chip enable signal CE# has been deactivated 230, the last data segment 222n present on the parallel interface Input/Output bus 75 is transferred and the read operation is ended.

In most embodiments, an operational cycle for the protocol begins with the activation 202 of the chip enable signal CE#. In most embodiments, the chip enable signal CE# is brought from a high state (logical "1") to a low state (logical "0"). The chip enable signal CE# will remain low for most commands, with the exceptions discussed hereinafter. The clock signal CLK is transferred with a duty cycle of approximately 50%. The command signals 208, address signals 214, read confirm command code 220, and the data signals 226 are captured or transferred on both the rising and falling edges of the clock signal CLK. Referring specifically to the command signals 208, address signals 214, read confirm command code 220, and data signals 226 of the parallel interface Input/Output bus 75, the command signals 208, address signals 214, and read confirm command code 220 have their transitions at a set up time prior to be captured at the rising and falling edges of the clock signal CLK by the nonvolatile memory units 70a, 70b, . . . , 70n of FIG. 1. The data signals 226 are triggered to be placed on the parallel interface Input/Output bus 75 at the transitions of the clock signal CLK. As for the specific command(s) as described in FIG. 5a, the command code 208 is for a NAND or NOR read operation. The address 214 provides the location of the first data to be read.

Figure 6A:
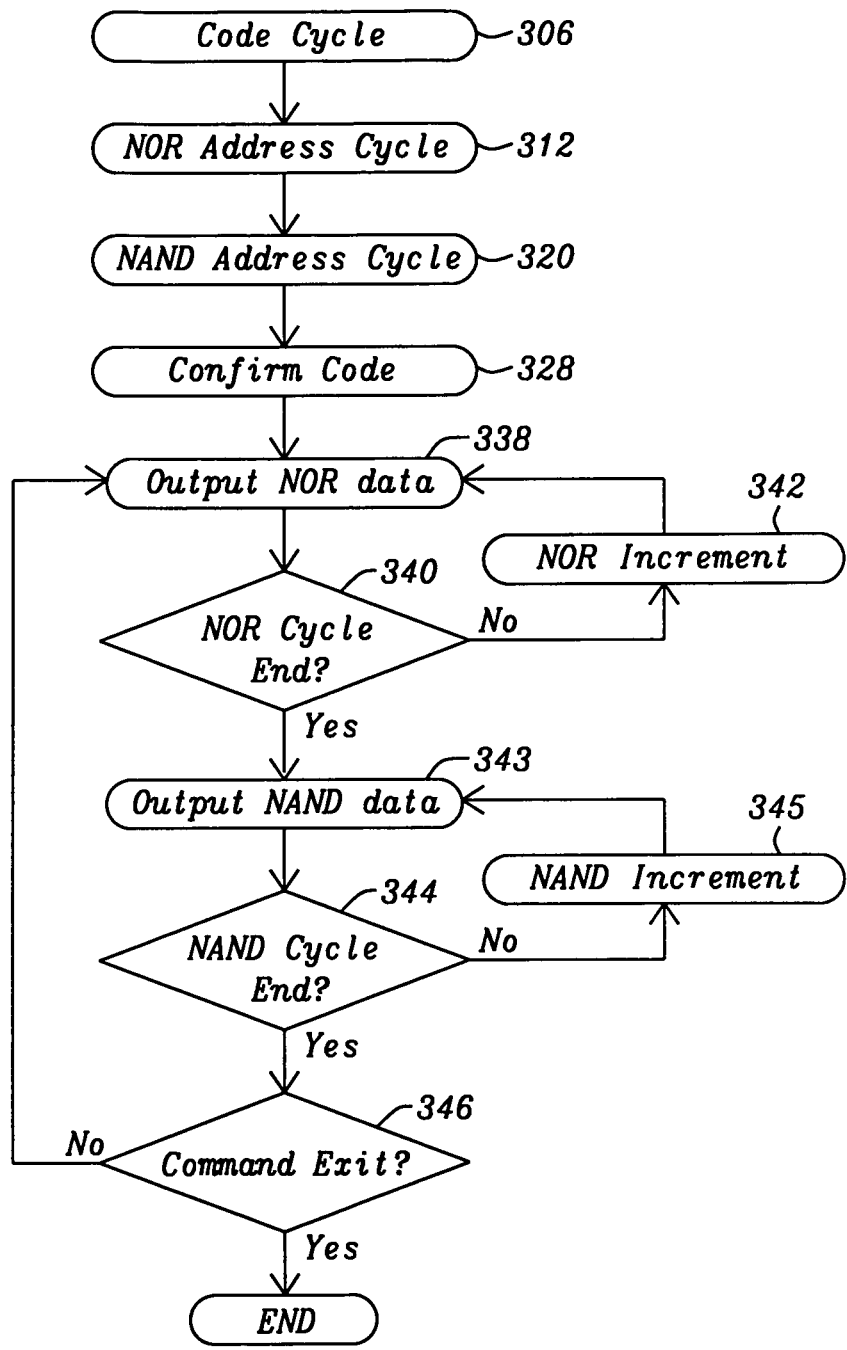
FIG. 6a is a flow chart of a method for a concurrent read operation of NAND and NOR nonvolatile memory arrays of a nonvolatile memory device embodying the principles of this invention.
Figure 6B:
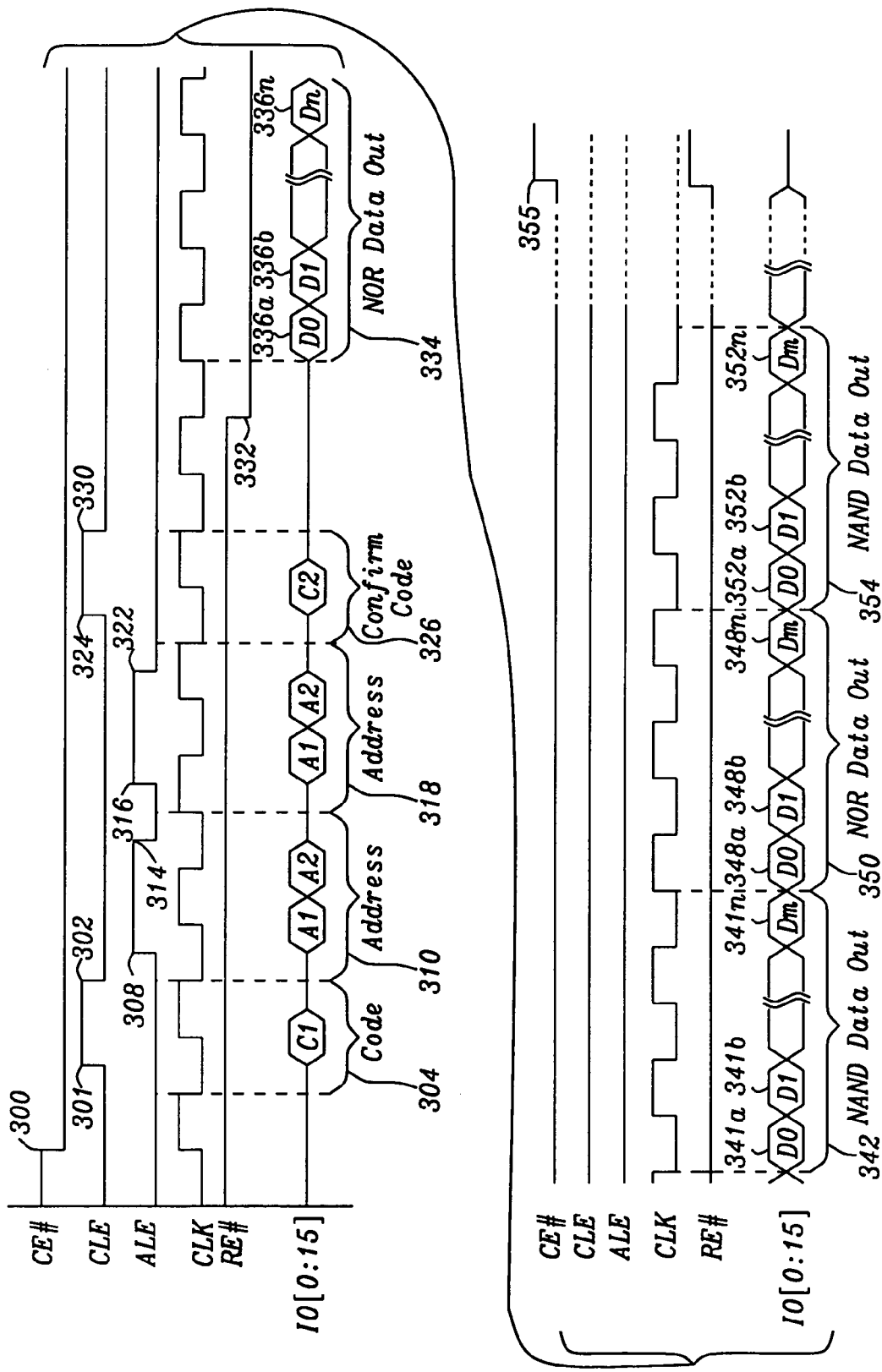
FIG. 6b is a timing diagram illustrating the waveforms of the parallel interface for a concurrent read operation of NAND and NOR nonvolatile memory arrays of a nonvolatile memory device embodying the principles of this invention.

FIG. 6a is a flow chart of a method for a concurrent read operation of the NAND nonvolatile memory array elements 100 and NOR nonvolatile memory array elements 105 of the nonvolatile memory device 70 of FIG. 2. FIG. 6b is a timing diagram illustrating the waveforms of the parallel interface 15 for a concurrent read operation of the NAND nonvolatile memory array 100 and NOR nonvolatile memory array 105 of the nonvolatile memory device 70 of FIG. 2. Referring to FIGS. 6a and 6b, the operational cycle for the concurrent read operation of a NAND nonvolatile memory array 100 and NOR nonvolatile memory array 105 begins with the activation 300 of the chip enable signal CE#. The chip enable signal CE# is brought from a high state (logical "1") to a low state (logical "0"). The clock signal CLK is transferred with a duty cycle of approximately 50%. The Command Latch Enable signal CLE is activated 301 and the command code 304 is received and decoded (Box 306) for the concurrent NAND and NOR read operation. The Command Latch Enable signal CLE is deactivated 302 and the Address Latch Enable signal ALE is activated 308 and the NOR array address 310 is received and decoded (Box 312) to provide the location of the first data to be read from the NOR array elements 105. The Address Latch Enable signal ALE is deactivated 314 and the Address Latch Enable signal ALE is activated 316 again. The address 318 is received and decoded (Box 320) to provide the location of the first data to read from the NAND array. The address space A[m:0] for the NOR array is determined by the density of the NOR array and the address space A[n:0] is determined by the density of the NAND array. During the period that the NAND address 318 and the read confirm command code 326 is received, the address 310 for the NOR array is decoded and the selected location data is accessed and the data is retrieved. The quantity of data 336a, 336b, . . . , 336n that is retrieved from the NOR array is determined by the command code 304.

At the completion the reception of the address 318 from the NAND array, the Address Latch Enable signal ALE is deactivated 322 and the Command Latch Enable signal CLE is again activated 324. The read confirm command code 326 is received and decoded (Box 328) for the confirmation concurrent NAND and NOR read operation. It should be noted that the read confirm command code 326 forces the unselected NAND nonvolatile memory array elements 100 and NOR nonvolatile memory arrays 105 within the selected multiple nonvolatile memory units 70a, 70b, . . . , 70n and the unselected multiple nonvolatile memory units 70a, 70b, . . . , 70n to deactivate their connections to the parallel interface Input/Output bus 75.

The Command Latch Enable signal CLE is deactivated 330 and the Read Enable signal RE# is activated 332. The first segment 336a (byte, word, or page) of the data 334 from the NOR array is transmitted (Box 338) to the parallel interface Input/Output bus 75 and thus to the host electronic device 5. An address pointer counter (not shown) within the parallel interface control circuit 110 contains the address pointer that provides the address to access the next data segment 336a, 336b, . . . , 336n of the NOR output data 334. The address pointer counter is examined (Box 340) to determine that all the NOR output data 334 has been transmitted (Box 338) to the parallel interface Input/Output bus 75. If all the NOR output data 334 has not been transferred, the address pointer counter is incremented (Box 342). The next segment 336b of the data 334 from the NOR array is transmitted (Box 338) to the parallel interface Input/Output bus 75 and thus to the host electronic device 5. The address pointer counter is again examined (Box 340) to determine that all the NOR output data 334 has been transmitted (Box 338) to the parallel interface Input/Output bus 75. The address pointer counter is again incremented to access the next data segment 336a, 336b, . . . , 336n of the output data 334. This continues process continues until the last segment 336n of the output data 334 is transmitted (Box 338) to the parallel interface Input/Output bus 75.

When the address pointer counter is examined (Box 340) and it is determined that all the NOR output data 334 has been transmitted (Box 338) to the parallel interface Input/Output bus 75, the address of the first segment 344a of the NAND output data 342 is transmitted (Box 343) to the parallel interface Input/Output bus 75. The address pointer counter is examined (Box 344) to determine that all the NAND output data 342 has been transmitted (Box 343) to the parallel interface Input/Output bus 75. If all the NAND output data 343 has not been transmitted to the parallel interface Input/Output bus 75, the address pointer counter is incremented (Box 345). The second segment 344b of the NAND output data 342 is transmitted (Box 343) to the parallel interface Input/Output bus 75. The address pointer counter is again examined (Box 340) to determine that all the NAND output data 342 has been transmitted (Box 343) to the parallel interface Input/Output bus 75.

When the last segment 341n of the NAND output data 343 has been transmitted to the parallel interface Input/Output bus 75, the chip enable signal CE# is examined (Box 346) to determine if the chip enable signal CE# has been deactivated 355. If the chip enable signal CE# has not been deactivated 355, the first segment 348a of the next NOR output data 350 is transmitted (Box 348) to the parallel interface Input/Output bus 75 and thus to the host electronic device 5. As above, the address pointer counter is examined (Box 340) to determine if all the NOR output data 350 is transmitted to the parallel interface Input/Output bus 75. If not, the address pointer is incremented (Box 342) and the next segment 348b is transferred to the parallel interface Input/Output bus 75. The data 350 is transferred (Box 338), the address pointer examined (Box 340), and the address pointer is incremented (Box 342) until when the address pointer is examined (Box 340), the last segment 348n is transmitted to the parallel interface Input/Output bus 75.

When the address pointer counter is examined (Box 340) and it is determined that all the NOR output data 350 has been transmitted (Box 338) to the parallel interface Input/Output bus 75, the address of the first segment 342a of the NAND output data 342 is transmitted (Box 343) to the parallel interface Input/Output bus 75. The address pointer counter is examined (Box 344) to determine that all the NAND output data 354 has been transmitted (Box 343) to the parallel interface Input/Output bus 75. If all the NAND output data 343 has not been transmitted to the parallel interface Input/Output bus 75, the address pointer counter is incremented (Box 345). The second segment 352b of the NAND output data 342 is transmitted (Box 343) to the parallel interface Input/Output bus 75. The address pointer counter is again examined (Box 340) to determine that all the NAND output data 342 has been transmitted (Box 343) to the parallel interface Input/Output bus 75.

When the address pointer counter is examined (Box 344) and it is determined that all the NAND output data 354 has been transmitted (Box 343) to the parallel interface Input/Output bus 75, the chip enable signal CE# is examined (Box 346) if it has been deactivated 355. If the chip enable signal CE# has not been deactivated 355, the next NOR output data and NAND output data are transferred to the parallel interface Input/Output bus 75 until it is determined (Box 346) that the chip enable signal CE# has been deactivated 355. When the chip enable signal CE# has been deactivated 355, the combined read operation of the NAND nonvolatile memory array elements 100 and NOR nonvolatile memory array elements 105 is ended.

Figure 7A:
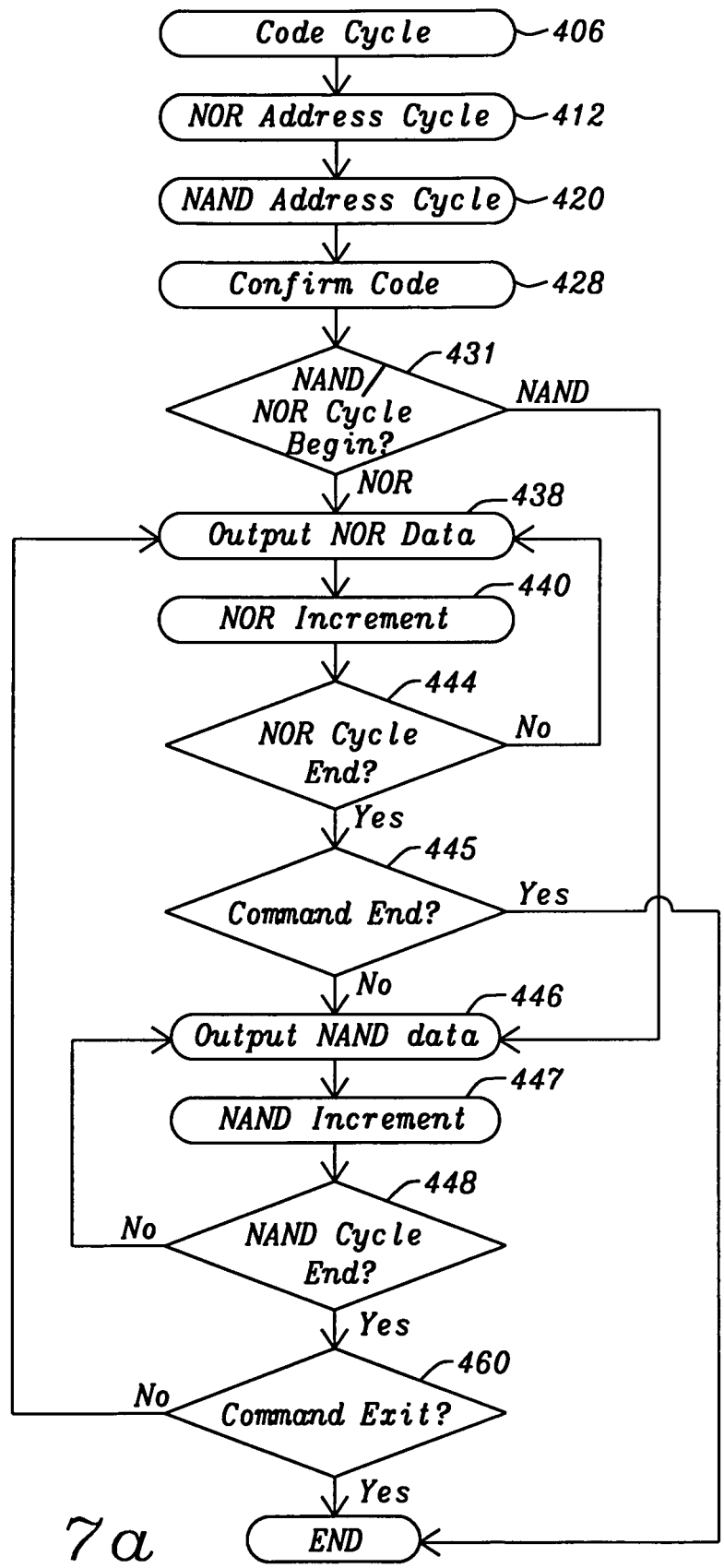
FIG. 7a is a flow chart of a method for another embodiment of a concurrent read operation of NAND and NOR nonvolatile memory arrays of a nonvolatile memory device embodying the principles of this invention.
Figure 7B:
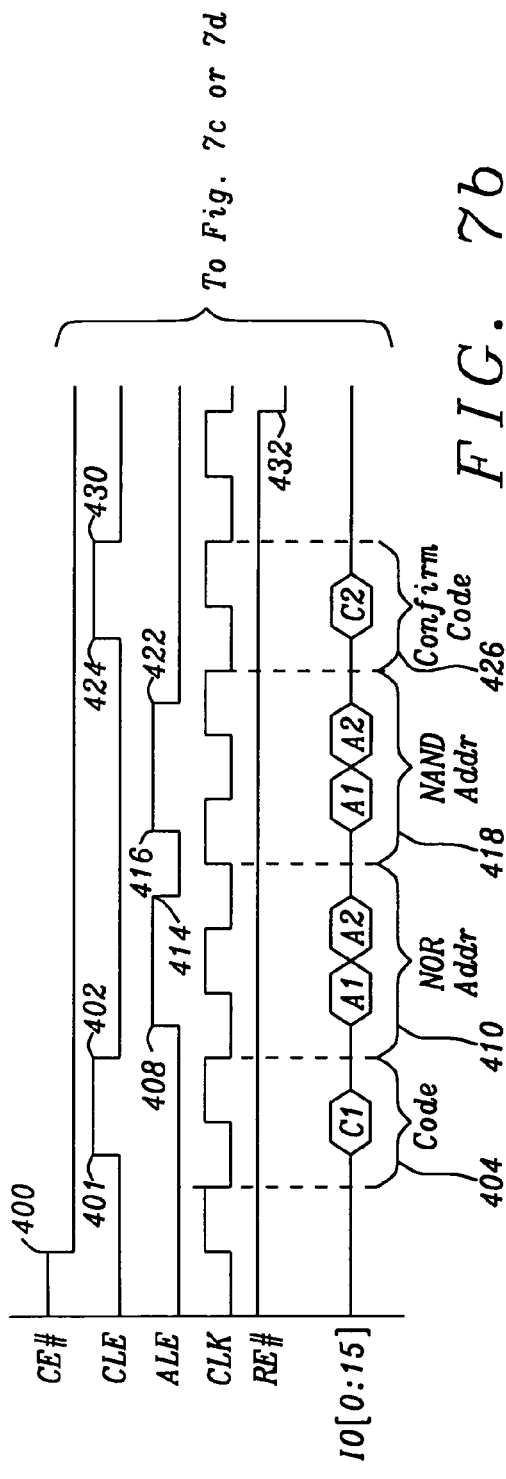
FIGS. 7b, 7c, and 7d are a timing diagram illustrating the waveforms of the parallel interface for another embodiment of a concurrent read operation of NAND and NOR nonvolatile memory arrays of a nonvolatile memory device embodying the principles of this invention.
Figure 7C:
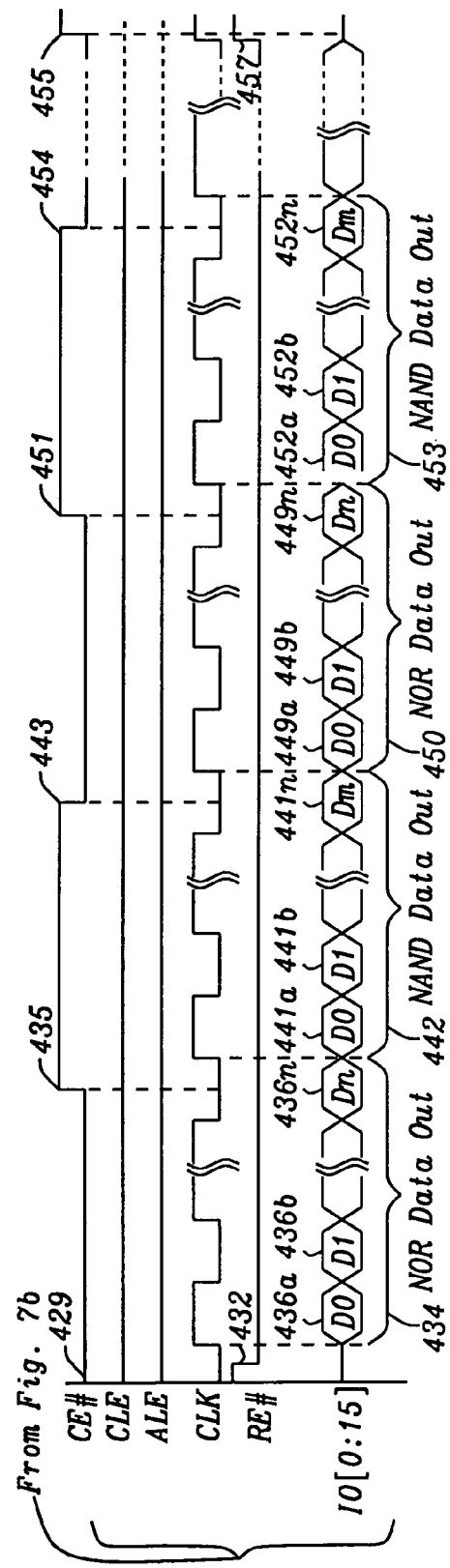
Figure 7D:
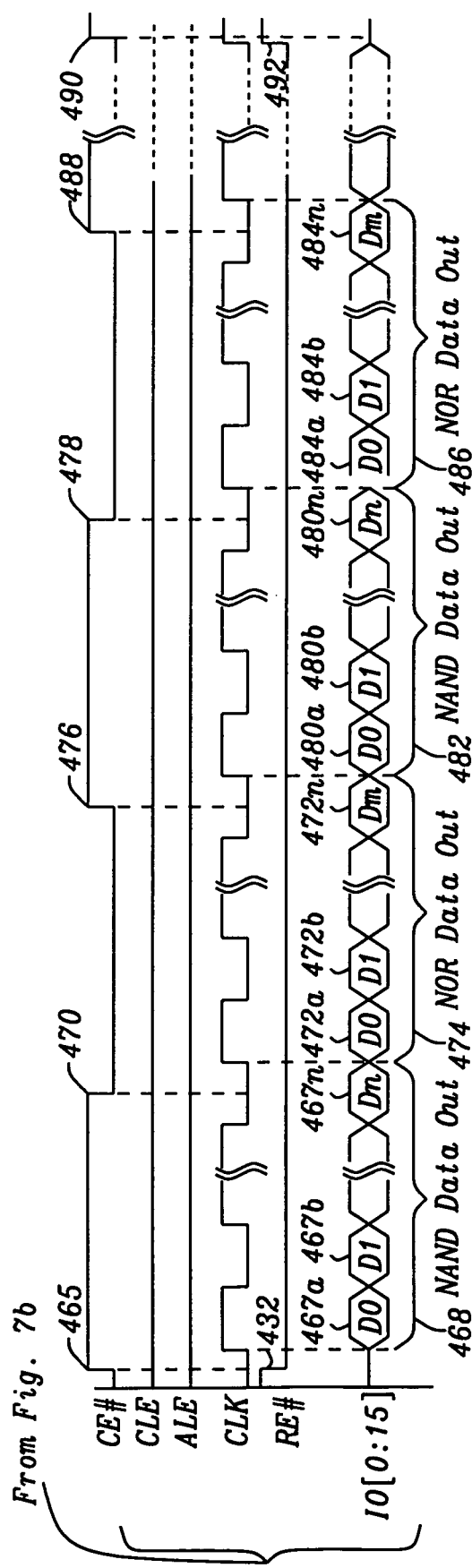

FIG. 7a is a flow chart of a method for another embodiment of a concurrent read operation of the NAND nonvolatile memory array 100 and NOR nonvolatile memory array 105 of the nonvolatile memory device 70 of FIG. 2. FIGS. 7b, 7c, and 7d are a timing diagram illustrating the waveforms of the parallel interface 15 for the embodiment of FIG. 7a of a concurrent read operation of the NAND nonvolatile memory array 100 and NOR nonvolatile memory array 105 of the nonvolatile memory device 70 of FIG. 2. Referring to FIGS. 7a, 7b, 7c, and 7d, the operational cycle for the concurrent read operation of a NAND nonvolatile memory array elements 100 and NOR nonvolatile memory array elements 105 begins with the activation 400 of the chip enable signal CE#. The chip enable signal CE# is brought from a high state (logical "1") to a low state (logical "0"). The clock signal CLK is transferred with a duty cycle of approximately 50%. The Command Latch Enable signal CLE is activated 401 and the command code 404 is received and decoded (Box 406) for the concurrent NAND and NOR read operation. The Command Latch Enable signal CLE is deactivated 402 and the Address Latch Enable signal ALE is activated 408 and the NOR array address 410 is received and decoded (Box 412) to provide the location of the first data to be read from the NOR array element 105. The Address Latch Enable signal ALE is deactivated 414 and the Address Latch Enable signal ALE is activated 416 again. The NAND array address 418 is received and decoded (Box 420) to provide the location of the first data to read from the NAND array. The address space A[m:0] for the NOR array is determined by the density of the NOR array and the address space A[n:0] is determined by the density of the NAND array. During the period that the NAND address 418 and the read confirm command code 426 is received, the address 410 for the NOR array is decoded and the selected location data is accessed and the data is retrieved. The quantity of data 436a, 436b, . . . , 436n that is retrieved from the NOR array is determined by the command code 404.

At the completion the reception of the address 418 from the NAND array, the Address Latch Enable signal ALE is deactivated 422 and the Command Latch Enable signal CLE is again activated 424. The read confirm command code 426 is received and decoded (Box 428) for the confirmation concurrent NAND and NOR read operation. It should be noted that the read confirm command code 426 forces the unselected NAND nonvolatile memory array elements 100 and NOR nonvolatile memory arrays 105 within the selected multiple nonvolatile memory units 70a, 70b, . . . , 70n and the unselected multiple nonvolatile memory units 70a, 70b, . . . , 70n to deactivate their connections to the parallel interface Input/Output bus 75. The Command Latch Enable signal CLE is deactivated 430.

The chip enable signal CE# is examined (Box 431) to determine if the chip enable signal CE# has been activated 429 or deactivated 465 when the clock CLK is at a low level to establish if the first cycle is to be a NOR read or a NAND read. If the chip enable signal CE# remains activated 429 and has not been deactivated 465, the first read cycle is a NOR read cycle and the Read Enable signal RE# is activated 432. Referring to FIG. 7c, the first segment 436a (byte, word, or page) of the data 434 from the NOR array is transmitted (Box 438) to the parallel interface Input/Output bus 75 and thus to the host electronic device 5. An address pointer counter (not shown) within the parallel interface control circuit 110 contains the address pointer that provides the address to access the next data segment 436a, 436b, . . . , 436n of the NOR output data 434. The address pointer counter is incremented (Box 440). The chip enable signal CE# is examined (Box 444) to determine if the chip enable signal CE# has been deactivated 435 when the clock CLK is at a low level to indicate that all the NOR output data 434 has been transmitted (Box 438) to the parallel interface Input/Output bus 75. If all the NOR output data 434 has been not transferred, the next segment 436b of the data 434 from the NOR array is transmitted (Box 438) to the parallel interface Input/Output bus 75 and thus to the host electronic device 5. The address pointer counter is again incremented (Box 440) to access the next data segment 436a, 436b, . . . , 436n of the output data 434. The chip enable signal CE# is again examined (Box 444) when the clock CLK is at a low level to determine if the chip enable signal CE# has been deactivated 435 to indicate that all the NOR output data 434 has been transmitted (Box 438) to the parallel interface Input/Output bus 75. This process continues until the last segment 436n of the output data 434 is transmitted (Box 438) to the parallel interface Input/Output bus 75.

When the chip enable signal CE# is examined (Box 444) and it is determined that the NOR output data 434 cycle is complete, it is determined (Box 444) if the NOR and NAND read command is completed. The chip enable signal CE# is examined to determine if the chip enable signal CE# has been deactivated when the clock CLK is at a high level and the read enable signal RE# is inactive. If the NOR and NAND read command not complete, the address of the first segment 441a of the NAND output data 442 is transmitted (Box 446) to the parallel interface Input/Output bus 75. The address pointer counter is incremented (Box 447). The chip enable signal CE# is examined (Box 448) to determine if the chip enable signal CE# has been activated 443 when the clock CLK is at a low level to indicate that all the NAND output data 442 has been transmitted (Box 445) to the parallel interface Input/Output bus 75. If all the NAND output data 443 has not been transmitted to the parallel interface Input/Output bus 75, the second segment 441b of the NAND output data 442 is transmitted (Box 446) to the parallel interface Input/Output bus 75. The chip enable signal CE# is examined (Box 448) to determine if the chip enable signal CE# has been activated 443 when the clock CLK is at a low level to indicate that all the NAND output data 442 has been transmitted (Box 446) to the parallel interface Input/Output bus 75.

When the last segment 441n of the NAND output data 443 has been transmitted to the parallel interface Input/Output bus 75, the chip enable signal CE# is examined (Box 448) to determine if the chip enable signal CE# has been activated 443 when the clock CLK is at a low level. If the chip enable signal CE# has been activated 443 when the clock CLK is at a low level to indicate if the NAND read cycle has been completed, it is determined (Box 460) if the NOR and NAND read command is completed. The chip enable signal CE# is examined to determine if the chip enable signal CE# has been deactivated when the clock CLK is at a high level and the read enable signal RE# is inactive.

If the read cycle has been completed and the NOR and NAND read command not complete, the first segment 449a of the next NOR output data 450 is transmitted (Box 438) to the parallel interface Input/Output bus 75 and thus to the host electronic device 5. As above, the first segment 449a (byte, word, or page) of the data 450 from the NOR array is transmitted (Box 438) to the parallel interface Input/Output bus 75 and thus to the host electronic device 5. An address pointer counter (not shown) within the parallel interface control circuit 110 contains the address pointer that provides the address to access the next data segment 449a, 449b, . . . , 449n of the NOR output data 450. The address pointer counter is incremented (Box 440). The chip enable signal CE# is examined (Box 444) to determine if the chip enable signal CE# has been deactivated 451 when the clock CLK is at a low level to indicate that all the NOR output data 450 has been transmitted (Box 438) to the parallel interface Input/Output bus 75. If all the NOR output data 434 has been not transferred, the next segment 449b of the data 450 from the NOR array is transmitted (Box 438) to the parallel interface Input/Output bus 75 and thus to the host electronic device 5. The address pointer counter is again incremented (Box 440) to access the next data segment 449a, 449b, . . . , 449n of the output data 450. The chip enable signal CE# is again examined (Box 444) when the clock CLK is at a low level to determine if the chip enable signal CE# has been deactivated 451 to indicate that all the NOR output data 450 has been transmitted (Box 438) to the parallel interface Input/Output bus 75. This process continues until the last segment 449n of the NOR output data 450 is transmitted (Box 438) to the parallel interface Input/Output bus 75.

When the chip enable signal CE# is examined (Box 444) and it is determined that the NOR output data 450 cycle is complete, it is determined (Box 444) if the NOR and NAND read command is completed. The chip enable signal CE# is examined to determine if the chip enable signal CE# has been deactivated when the clock CLK is at a high level and the read enable signal RE# is inactive. If the NOR and NAND read command not complete, the address of the first segment 452a of the NAND output data 453 is transmitted (Box 446) to the parallel interface Input/Output bus 75. The address pointer counter is incremented (Box 447). The chip enable signal CE# is examined (Box 448) to determine if the chip enable signal CE# has been activated 443 when the clock CLK is at a low level to indicate that all the NAND output data 442 has been transmitted (Box 445) to the parallel interface Input/Output bus 75. If all the NAND output data 443 has not been transmitted to the parallel interface Input/Output bus 75, the second segment 441b of the NAND output data 442 is transmitted (Box 446) to the parallel interface Input/Output bus 75. The chip enable signal CE# is examined (Box 448) to determine if the chip enable signal CE# has been activated 443 when the clock CLK is at a low level to indicate that all the NAND output data 442 has been transmitted (Box 446) to the parallel interface Input/Output bus 75 and the NAND read cycle is completed.

When the last segment of the NAND output data or NOR output data has been transmitted to the parallel interface Input/Output bus 75, it is determined (Box 460) if the NOR and NAND read command is completed. The chip enable signal CE# is examined to determine if the chip enable signal CE# has been deactivated 455 when the clock CLK is at a high level and the read enable signal RE# is inactive 457. When it is determined that the NOR and NAND read command is completed the process is ended.

When the chip enable signal CE# is examined (Box 431) to determine if the first cycle is to be a NOR read or a NAND read and the chip enable signal CE# has been deactivated 465, the first read cycle is to be a NAND read. The address of the first segment 467a of the NAND output data 468 is transmitted (Box 446) to the parallel interface Input/Output bus 75. The address pointer counter is incremented (Box 447). The chip enable signal CE# is examined (Box 448) to determine if the chip enable signal CE# has been activated 470 when the clock CLK is at a low level to indicate that all the NAND output data 468 has been transmitted (Box 445) to the parallel interface Input/Output bus 75. If all the NAND output data 468 has not been transmitted to the parallel interface Input/Output bus 75, the second segment 441b of the NAND output data 442 is transmitted (Box 446) to the parallel interface Input/Output bus 75. The chip enable signal CE# is examined (Box 448) to determine if the chip enable signal CE# has been activated 470 when the clock CLK is at a low level to indicate that all the NAND output data 468 has been transmitted (Box 446) to the parallel interface Input/Output bus 75.

When the last segment 467n of the NAND output data 443 has been transmitted to the parallel interface Input/Output bus 75, the chip enable signal CE# is examined (Box 448) to determine if the chip enable signal CE# has been activated 470 when the clock CLK is at a low level. If the chip enable signal CE# has been activated 470 when the clock CLK is at a low level to indicate if the NAND read cycle has been completed, it is determined (Box 460) if the NOR and NAND read command is completed. The chip enable signal CE# is examined to determine if the chip enable signal CE# has been deactivated when the clock CLK is at a high level and the read enable signal RE# is inactive.

If the read cycle has been completed and the NOR and NAND read command not complete, the first segment 472a of the next NOR output data 474 is transmitted (Box 438) to the parallel interface Input/Output bus 75 and thus to the host electronic device 5. As above, the first segment 472a (byte, word, or page) of the data 474 from the NOR array is transmitted (Box 438) to the parallel interface Input/Output bus 75 and thus to the host electronic device 5. The address pointer provides the address to access the next data segment 472a, 472b, . . . , 472n of the NOR output data 472. The address pointer counter is incremented (Box 440). The chip enable signal CE# is examined (Box 444) to determine if the chip enable signal CE# has been deactivated 476 when the clock CLK is at a low level to indicate that all the NOR output data 434 has been transmitted (Box 438) to the parallel interface Input/Output bus 75. If all the NOR output data 474 has been not transferred, the next segment 472b of the data 474 from the NOR array is transmitted (Box 438) to the parallel interface Input/Output bus 75 and thus to the host electronic device 5. The address pointer counter is again incremented (Box 440) to access the next data segment 472a, 472b, . . . , 472n of the output data 474. The chip enable signal CE# is again examined (Box 444) when the clock CLK is at a low level to determine if the chip enable signal CE# has been deactivated 476 to indicate that all the NOR output data 476 has been transmitted (Box 438) to the parallel interface Input/Output bus 75. This process continues until the last segment 472n of the NOR output data 472 is transmitted (Box 438) to the parallel interface Input/Output bus 75.

When the chip enable signal CE# is examined (Box 444) and it is determined that the NOR output data 474 cycle is complete, it is determined (Box 444) if the NOR and NAND read command is completed. The chip enable signal CE# is examined to determine if the chip enable signal CE# has been deactivated 476 when the clock CLK is at a high level and the read enable signal RE# is inactive. If the NOR and NAND read command not complete, the address of the first segment 480a of the NAND output data 482 is transmitted (Box 446) to the parallel interface Input/Output bus 75. The address pointer counter is incremented (Box 447). The chip enable signal CE# is examined (Box 448) to determine if the chip enable signal CE# has been activated 478 when the clock CLK is at a low level to indicate that all the NAND output data 482 has been transmitted (Box 445) to the parallel interface Input/Output bus 75. If all the NAND output data 482 has not been transmitted to the parallel interface Input/Output bus 75, the second segment 480b of the NAND output data 482 is transmitted (Box 446) to the parallel interface Input/Output bus 75. The chip enable signal CE# is examined (Box 448) to determine if the chip enable signal CE# has been activated 478 when the clock CLK is at a low level to indicate that all the NAND output data 482 has been transmitted (Box 446) to the parallel interface Input/Output bus 75 and the NAND read cycle is completed.

If the read cycle has been completed and the NOR and NAND read command not complete, the first segment 484a of the next NOR output data 486 is transmitted (Box 438) to the parallel interface Input/Output bus 75 and thus to the host electronic device 5. As above, the first segment 484a (byte, word, or page) of the data 486 from the NOR array is transmitted (Box 438) to the parallel interface Input/Output bus 75 and thus to the host electronic device 5. The address pointer provides the address to access the next data segment 484a, 484b, . . . , 484n of the NOR output data 486. The address pointer counter is incremented (Box 440). The chip enable signal CE# is examined (Box 444) to determine if the chip enable signal CE# has been deactivated 488 when the clock CLK is at a low level to indicate that all the NOR output data 486 has been transmitted (Box 438) to the parallel interface Input/Output bus 75. If all the NOR output data 486 has been not transferred, the next segment 484b of the data 486 from the NOR array is transmitted (Box 438) to the parallel interface Input/Output bus 75 and thus to the host electronic device 5. The address pointer counter is again incremented (Box 440) to access the next data segment 484a, 484b, . . . , 484n of the output data 486. The chip enable signal CE# is again examined (Box 444) when the clock CLK is at a low level to determine if the chip enable signal CE# has been deactivated 488 to indicate that all the NOR output data 486 has been transmitted (Box 438) to the parallel interface Input/Output bus 75. This process continues until the last segment 484n of the NOR output data 486 is transmitted (Box 438) to the parallel interface Input/Output bus 75.

When the last segment of the NAND output data or NOR output data has been transmitted to the parallel interface Input/Output bus 75, it is determined (Box 460) if the NOR and NAND read command is completed. The chip enable signal CE# is examined to determine if the chip enable signal CE# has been deactivated 490 when the clock CLK is at a high level and the read enable signal RE# is inactive 492. When it is determined that the NOR and NAND read command is completed the process is ended.

FIG. 8 is a timing diagram illustrating the waveforms of the parallel interface for an erase operation of a NAND nonvolatile memory array 100 and NOR nonvolatile memory array 105 of a nonvolatile memory device 70 of FIG. 2. The operational cycle for the erase of a NAND nonvolatile memory array 100 or NOR nonvolatile memory array 105 begins with the activation 500 of the chip enable signal CE#. The chip enable signal CE# is brought from a high state (logical "1") to a low state (logical "0"). The clock signal CLK is transferred with a duty cycle of approximately 50%. A code cycle is executed with the activation 502 of the Command Latch Enable signal CLE. The command code 504 is received and decoded to determine that the operation is to be an erase of selected NAND nonvolatile memory array elements 100 or NOR nonvolatile memory array elements 105. The Command Latch Enable signal CLE is deactivated 506 and the address latch enable ALE is activated 508. The address 510 provides the location of the data to be erased from the NOR array or from the NAND array. The address space A[m:0] for the NOR array or the NAND array is determined by the density of the NOR array or the density of the NAND array.

The address latch enable ALE is deactivated 512 and the command latch enable CLE is activated again. The erase confirm command code 516 is received and decoded and the Ready/Busy signal R/B# is activated.

The Command Latch Enable signal CLE is deactivated 518 and the NAND nonvolatile memory array 100 or the NOR nonvolatile memory array 105 activates the erase process and the segment (page, block, sector, or entire chip) of the NAND nonvolatile memory array 100 or the NOR nonvolatile memory array 105 is erased.

FIG. 9 is a timing diagram illustrating the waveforms of the parallel interface for a program operation of a NAND nonvolatile memory array 100 and NOR nonvolatile memory array 105 of a nonvolatile memory device 70 of FIG. 2. The operational cycle for the program of a NAND nonvolatile memory array elements 100 or NOR nonvolatile memory array elements 105 begins with the activation 600 of the chip enable signal CE#. The chip enable signal CE# is brought from a high state (logical "1") to a low state (logical "0"). The clock signal CLK is transferred with a duty cycle of approximately 50%. A code cycle is executed with the activation 602 of the Command Latch Enable signal CLE. The command code 604 is received and decoded to determine that the operation is to be a program of the NAND nonvolatile memory array elements 100 or NOR nonvolatile memory array elements 105. The Command Latch Enable signal CLE is deactivated 606 and the address latch enable ALE is activated 608. The address 610 is received and decoded to provide the location of the data to be read from the NAND array elements 100 or from the NOR array elements 105.

The address latch enable ALE is deactivated 612 and data to be programmed is received and transferred to the NAND array elements 100 or the NOR array elements 105 from programming. The command latch enable CLE is activated 616 again and the program confirm command code 618 is received and decoded. The Ready/Busy signal R/B# is activated 620.

The Command Latch Enable signal CLE is deactivated 622 and the NAND nonvolatile memory array elements 100 or the NOR nonvolatile memory array elements 105 activates the program process and the segment (page, block, sector, or entire chip) of the NAND nonvolatile memory array elements 100 or the NOR nonvolatile memory array elements 105 is programmed. The Ready/Busy signal R/B# is deactivated 624 and the chip enable signal CE# is deactivated 636 when the clock CLK is at a high level to end the NAND or NOR program command.

Figure 10:
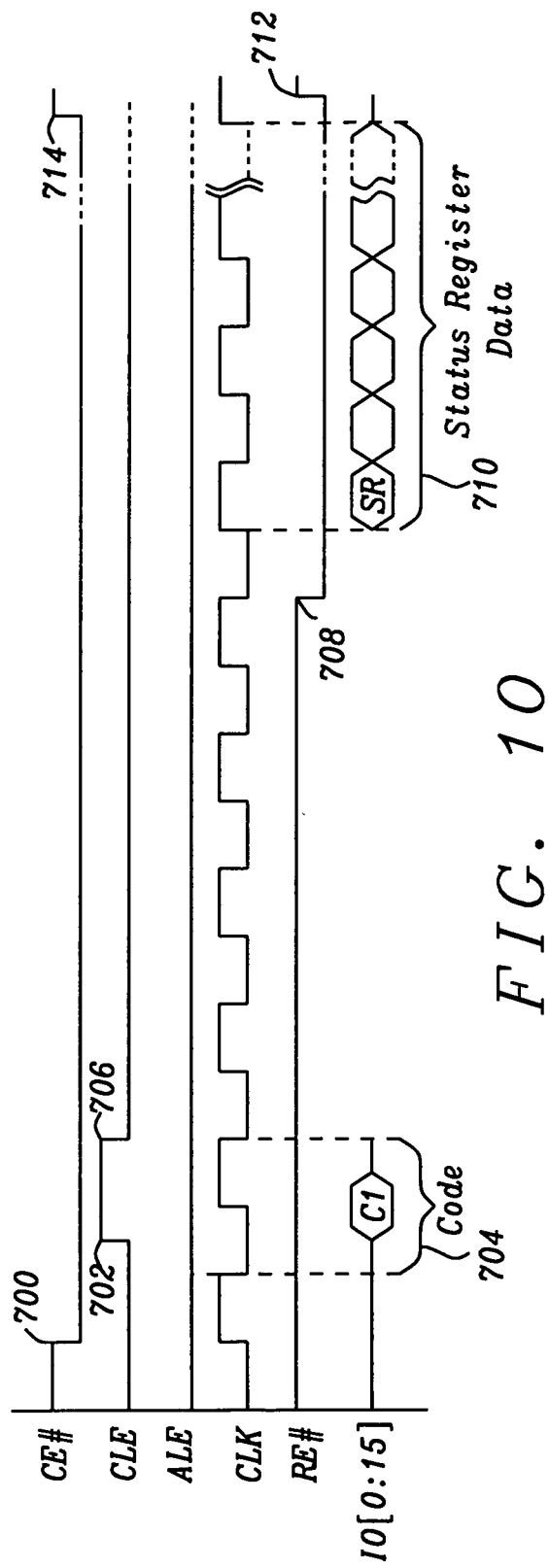
FIG. 10 is a timing diagram illustrating the waveforms of the parallel interface for a status register read operation of NAND or NOR nonvolatile memory arrays of a nonvolatile memory device embodying the principles of this invention.

FIG. 10 is a timing diagram illustrating the waveforms of the parallel interface for a status register read operation of a NAND nonvolatile memory array 100 and NOR nonvolatile memory array 105 of a nonvolatile memory device 70 of FIG. 2. The status register provides a record of the progress for a write (erase or program) operation to the NAND nonvolatile memory array 100 or the NOR nonvolatile memory array 105. The status register read operations are essentially memory read operations to specific locations within the NAND nonvolatile memory array 100 or the NOR nonvolatile memory array 105. The operational cycle for the status register read operation of a NAND nonvolatile memory array 100 or NOR nonvolatile memory array 105 begins with the activation 700 of the chip enable signal CE#. The chip enable signal CE# is brought 345 from a high state (logical "1") to a low state (logical "0"). The clock signal CLK is transferred with a duty cycle of approximately 50%. A code cycle is executed with the activation 702 of the Command Latch Enable signal CLE. The command code 704 is received and decoded to determine that the command code 704 is for the status register read operation. The status register identifier within the command code 704 provides the designator for the status register to be read from the selected NAND array elements 100 or from the NOR array elements 105. Once the location of the status register to be read is determined, the NAND nonvolatile memory array 100 or the NOR nonvolatile memory array 105 activates the status register read process. After a time delay the Read Enable signal RE# is activated 708 and status register contents 710 from the selected NAND array elements 100 or from the selected NOR array elements 105 is transferred to the parallel interface Input/Output bus 75. After the transmission of the status register contents 710, the Read Enable signal RE# is deactivated 712 and the chip enable signal CE# transitions 714 from the low level to the high level to end the status register read operation.

Figure 11A:
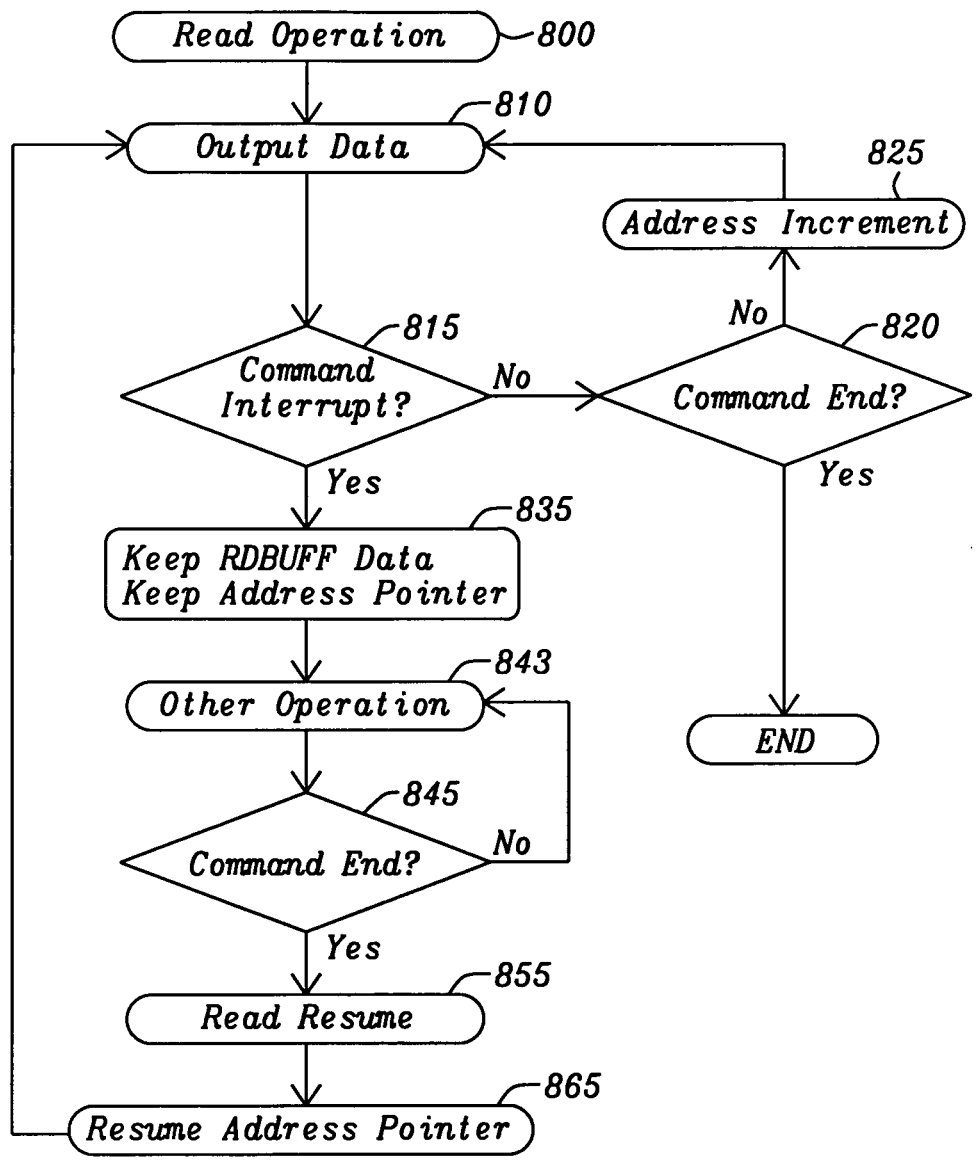
FIG. 11a is a flow chart of a method for a read resume operation of NAND or NOR nonvolatile memory arrays of a nonvolatile memory device embodying the principles of this invention.

FIG. 11a is a flow chart of a method for a read resume operation of the NAND nonvolatile memory array 100 and NOR nonvolatile memory array 105 of the nonvolatile memory device 70 of FIG. 2. FIG. 11b is a timing diagram illustrating the waveforms of the parallel interface for a read resume operation of the NAND nonvolatile memory array 100 and NOR nonvolatile memory array 105 of the nonvolatile memory device 70 of FIG. 2. In the read resume operation, a read operation (Box 800) as described above is in progress with the chip enable signal CE# at the low state (logical "0") and the clock signal CLK being transferred with a duty cycle of approximately 50%. The output data 805 is transferred (Box 810) to the parallel interface Input/Output bus 75. The chip enable signal CE# is examined (Box 815) to determine that a command interruption has occurred. If there is no interruption, the chip enable signal CE# is examined (Box 820) for a command end 875 and Read Enable signal RE# deactivation 872. If there is not command end 875 and Read Enable signal RE# deactivation 872, the address is incremented (Box 825) for the next segment of the output data 805 and the output data 805 is transferred (Box 810) to the parallel interface Input/Output bus 75.

When the clock signal CLK is at an extended low state, the chip enable signal CE# is brought 830 from the low state to the high state and then is returned to the low state, a command interrupt is determined (Box 815) to have occurred. Additionally, at this time the Read Enable signal RE# is deactivated 832. The NAND nonvolatile memory array 100 and NOR nonvolatile memory array 105 terminates the existing read operation. The data in memory read buffer 140 or 170 of FIG. 2 and current address pointer is retained (Box 835). At the transitions 838 of the Command Latch Enable signal CLE, the command code of a next operation 840 is decoded and the other operation 840 is executed (Box 843). The other operation 840 may be any operation with the exception of a memory read operation. The chip enable signal CE# is examined that the other operation 840 has completed (Box 845). If not, the other operation 860 is executed (Box 843) until the clock signal CLK is at an extended low state and the chip enable signal CE# is brought 850 from the low state to the high state and then is returned to the low state. The Command Latch Enable signal CLE is activated 857 and the command code 860 is received decoded to determine that the operation to be executed (Box 855) is for a read resume. The address pointer is restored (Box 865) and the read data 870 is transferred from the read buffer 140 or 170 to the parallel interface Input/Output bus 75 to complete the read operation (Box 810) initiated by the command of the operation (Box 800) that was interrupted. The chip enable signal CE# is examined (Box 815) to determine that a command interruption has occurred. If there is no interruption, the chip enable signal CE# is examined (Box 820) for a command end where the Command Latch Enable signal CLE is deactivated 875 and the Read Enable signal RE# is deactivated 872. If there is no command end, the address is incremented (Box 825) for the next segment of the output data 870 and the output data 870 is transferred (Box 410) to the parallel interface Input/Output bus 75. When the clock signal CLK is at high state, the chip enable signal CE# is brought 875 from the low state to the high state and the Read Enable signal RE# is deactivated 872, the command end is determined (Box 820) to have occurred and the read resume process is ended.

Figure 12A:
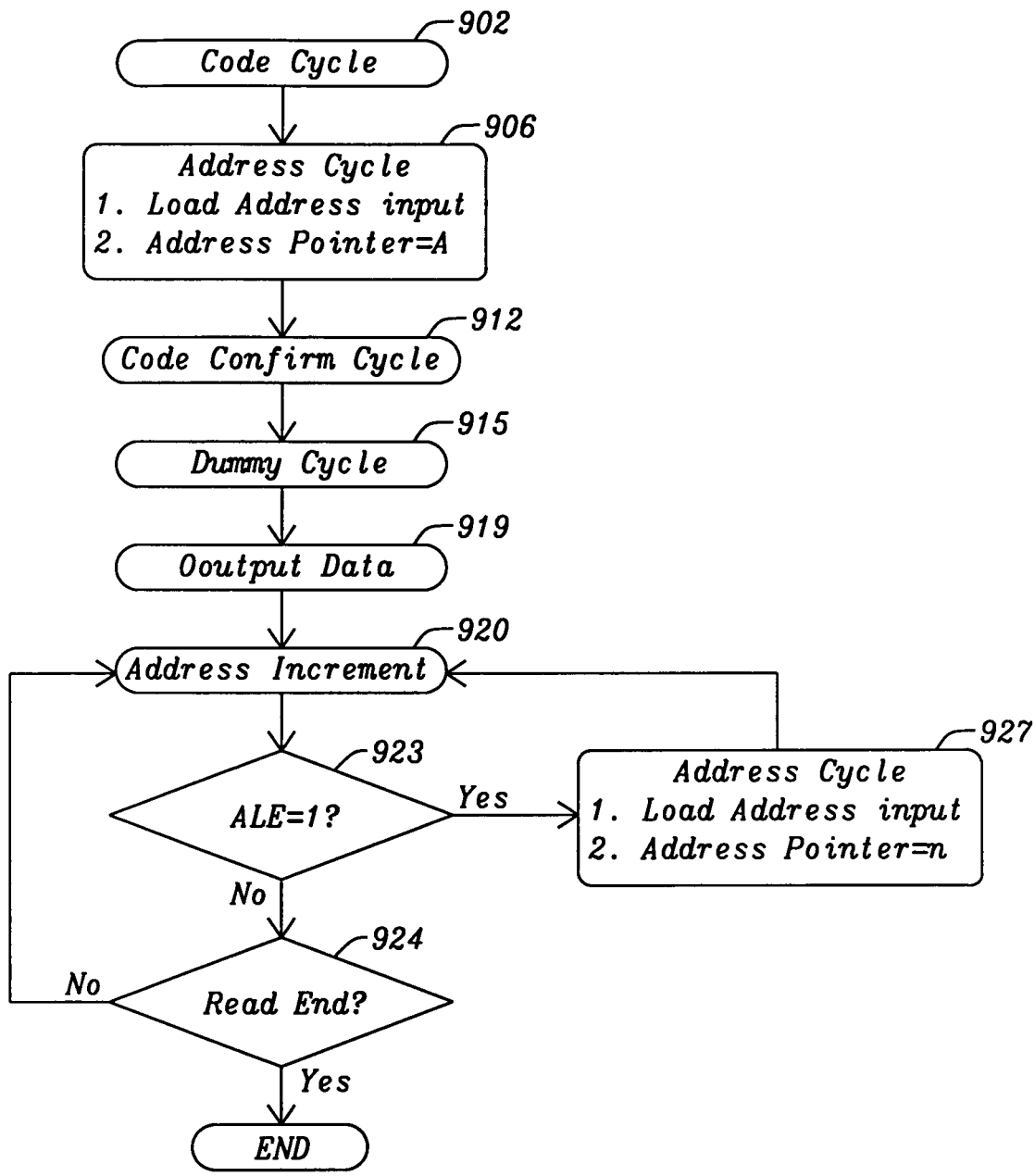
FIG. 12a is a flow chart of a method for a read jump operation of NAND or NOR nonvolatile memory arrays of a nonvolatile memory device embodying the principles of this invention.
Figure 12B:
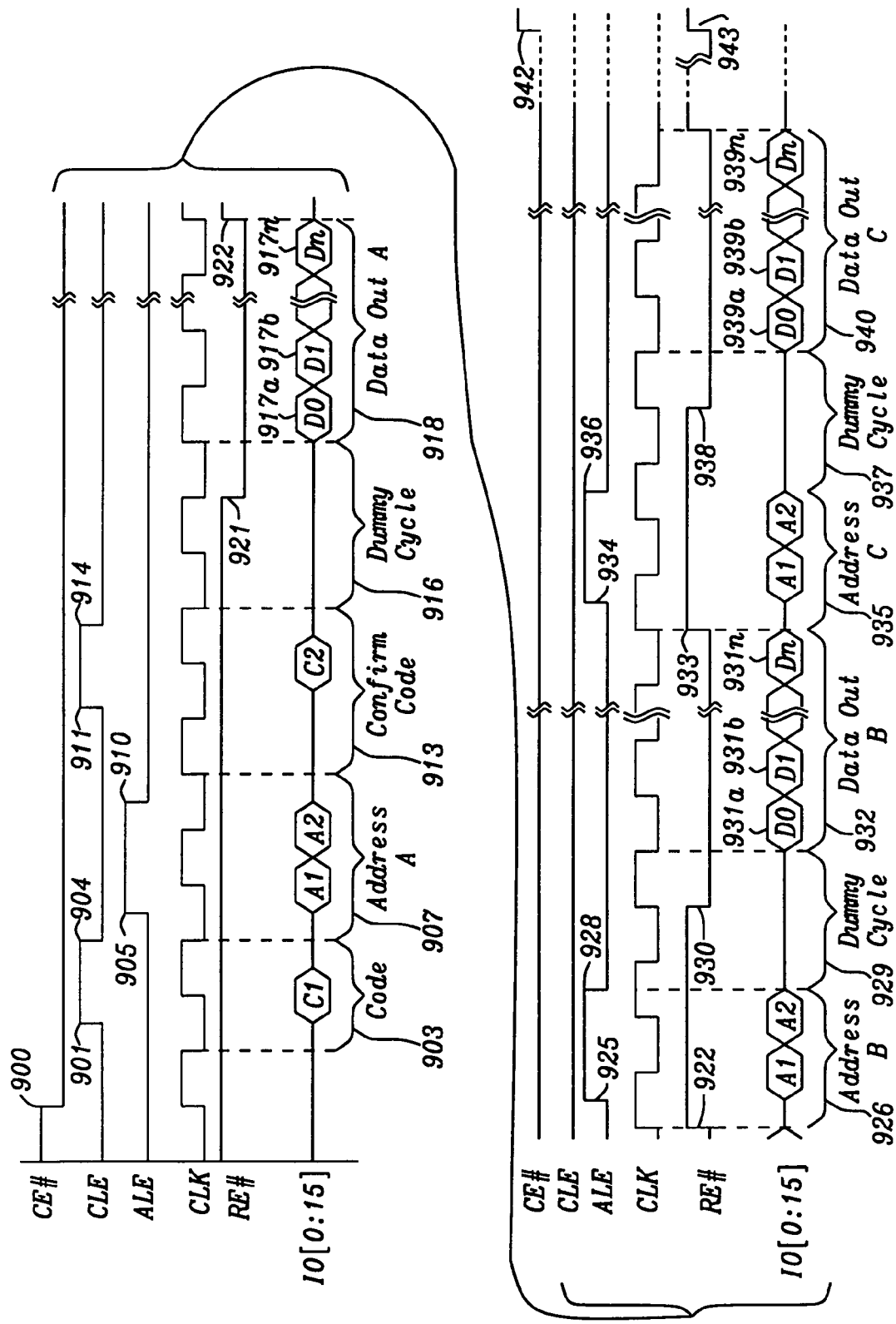
FIG. 12b is a timing diagram illustrating the waveforms of the parallel interface for a read jump operation of NAND or NOR nonvolatile memory arrays of a nonvolatile memory device embodying the principles of this invention.

FIG. 12a is a flow chart of a method for a read jump operation of NAND or NOR nonvolatile memory array elements 100 or 105 of a nonvolatile memory device 70 of FIG. 2. FIG. 12b is a timing diagram illustrating the waveforms of the parallel interface for a read jump operation of NAND or NOR nonvolatile memory array elements 100 or 105 of a nonvolatile memory device 70 of FIG. 2. Referring to FIGS. 12a and 12b, the protocol is structured such that a read jump operation is initiated at the activation 900 of the chip enable signal CE# and the activation 901 of the Command Latch Enable signal CLE for receiving and decoding (Box 902) a command code 903. The command code 903 describes that the action to be executed is a read jump indicating that the read operation for a selected NAND or NOR nonvolatile memory array elements 100 or 105 may be interrupted and the read will then be executed at a new location to continue the read operation. The command code 903 is as described in FIGS. 5a and 5b for the command code 208 of the normal read operation. The Command Latch Enable signal CLE is deactivated 904 and the address latch enable ALE is activated 905. The starting address 907 for the location of the initial data to be read is received and decoded (Box 906). The current address pointer (not shown) within the parallel interface control circuit 110 of FIG. 2 is set to the decoded starting address 907. The starting address 907 is structured is as described in FIGS. 5a and 5b for the address coded 203 of the normal read operation. The address latch enable ALE is deactivated 910 and the Command Latch Enable signal CLE is activated 911. The confirm command code 914 is received and decoded (Box 912). It should be noted that the read confirm command code 907 forces the unselected NAND nonvolatile memory array elements 100 and NOR nonvolatile memory array elements 105 within the selected multiple nonvolatile memory units 70a, 70b, . . . , 70n and the unselected multiple nonvolatile memory units 70a, 70b, . . . , 70n to deactivate their connections to the parallel interface Input/Output bus 75.

The dummy cycles 916 that are not decoded and ignored are allowed to elapse (Box 915). The dummy cycles 916 are approximately equivalent to the data access time for the selected NAND nonvolatile memory array elements 100 or NOR memory array elements 105. After the dummy cycles 916, the Read Enable signal RE# is activated 921 and the first addressed data 917a is transferred (Box 919) from the selected NAND or NOR nonvolatile memory array elements 100 or 105 to the parallel interface Input/Output bus 75 of FIG. 2.

The read operation (Box 919) as described above is in progress with the chip enable signal CE# at the low state (logical "0") and the clock signal CLK being transferred with a duty cycle of approximately 50%. The address pointer is incremented (Box 920). The address latch enable ALE is examined (Box 923) if it has been activated 934. If it has not been activated 934, the Read Enable signal RE# and the chip enable signal CE# are examined (Box 924) to determine that a read operation has ended. If read operation has not ended, the output data 917b for the next incremented address is transferred (Box 919) to the parallel interface Input/Output bus 75.

This process continues for the reading of the data segments 917a, 917b, ..., 917n of the second data output 918 until the Read Enable signal RE# is disabled and the address latch enable ALE is found to be activated 925 when examined (Box 923). The jump address 926 for the location of the second data to be read is received and decoded (Box 927). The current address pointer (not shown) within the parallel interface control circuit 110 of FIG. 2 is set to the decoded jump address 926. The jump address 926 is structured as is as described in FIGS. 5a and 5b for the address coded 203 of the normal read operation. The dummy cycles 929 that are not decoded and ignored are allowed to elapse (Box 915). After the dummy cycles 929, the Read Enable signal RE# is activated 930 and the first addressed data segment 931a is transferred (Box 919) from the selected NAND or NOR nonvolatile memory array elements 100 or 105 to the parallel interface Input/Output bus 75 of FIG. 2. The address pointer is incremented (Box 920). The address latch enable ALE is examined (Box 923) if it has been activated 934. If it has not been activated 934, the Read Enable signal RE# and the chip enable signal CE# are examined (Box 924) to determine that a read operation has ended. If read operation has not ended, the output data 917b for the next incremented address is transferred (Box 919) to the parallel interface Input/Output bus 75.

This process continues for the reading of the data segments 917a, 917b, ..., 917n of the first data output 918 until the Read Enable signal RE# is disabled and the address latch enable ALE is found to be activated 925 when examined (Box 923). The next jump address 935 for the location of the third data to be read is received and decoded (Box 927). The current address pointer (not shown) within the parallel interface control circuit 110 of FIG. 2 is set to the decoded third jump address 935. The dummy cycles 937 that are not decoded and ignored are allowed to elapse (Box 915). After the dummy cycles 937, the Read Enable signal RE# is activated 938 and the first addressed data segment 939a is transferred (Box 919) from the selected NAND or NOR nonvolatile memory array elements 100 or 105 to the parallel interface Input/Output bus 75 of FIG. 2.

The address pointer is incremented (Box 920). The address latch enable ALE is examined (Box 923) if it has been activated. If it has not been activated, the Read Enable signal RE# and the chip enable signal CE# are examined (Box 924) to determine that a read operation has ended. If read operation has not ended, the output data 939b for the next incremented address is transferred (Box 919) to the parallel interface Input/Output bus 75.

This process continues for the reading of the data segments 939a, 939b, ..., 939n of the first data output 918 until the Read Enable signal RE# is disabled 941 and the address latch enable ALE is found to be activated when examined (Box 923). Each address jump is processed until the final Read Enable signal RE# is found to be deactivated 943 and the chip enable signal CE# is found to be deactivated 942 when examined (Box 924). The Read jump operation is then ended.

Figure 13A:
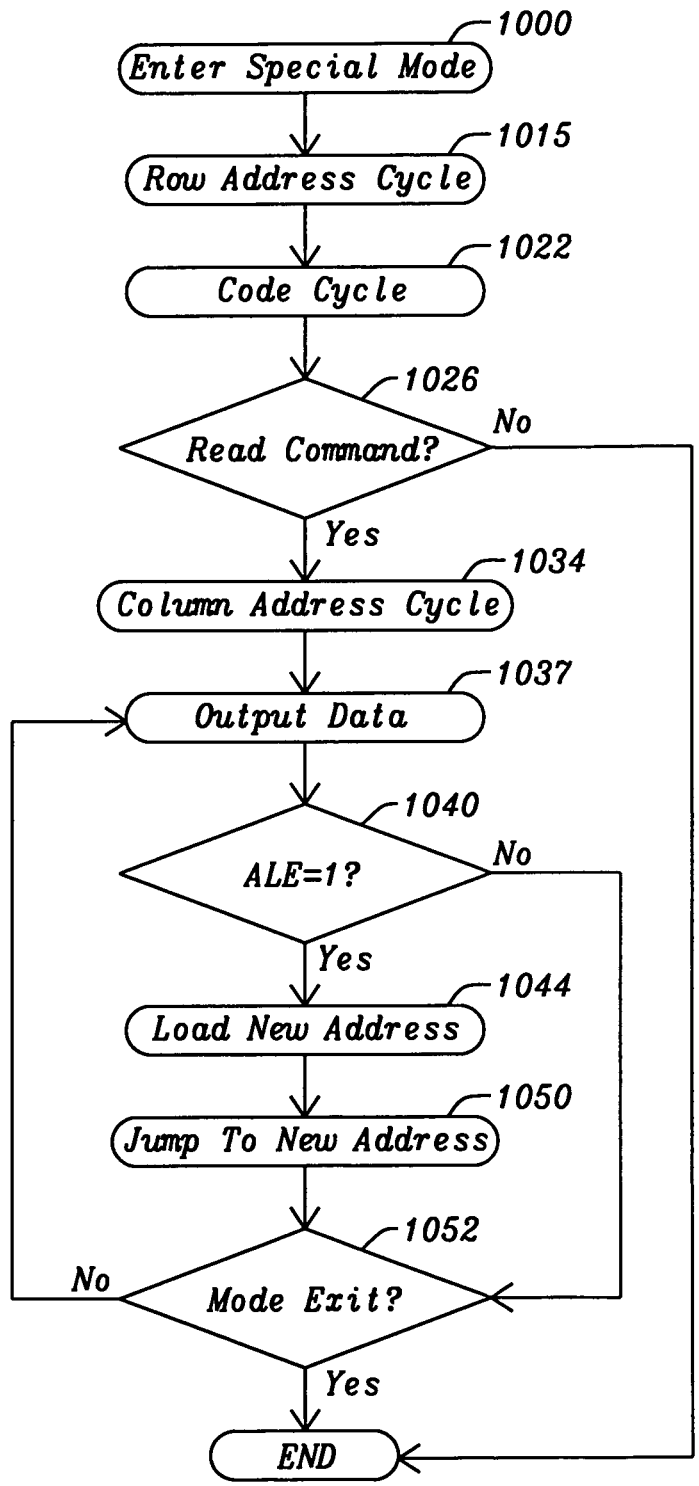
FIG. 13a is a flow chart of a method for an Address Ahead Input Read operation of NAND or NOR nonvolatile memory arrays of a nonvolatile memory device embodying the principles of this invention.
Figure 13B:
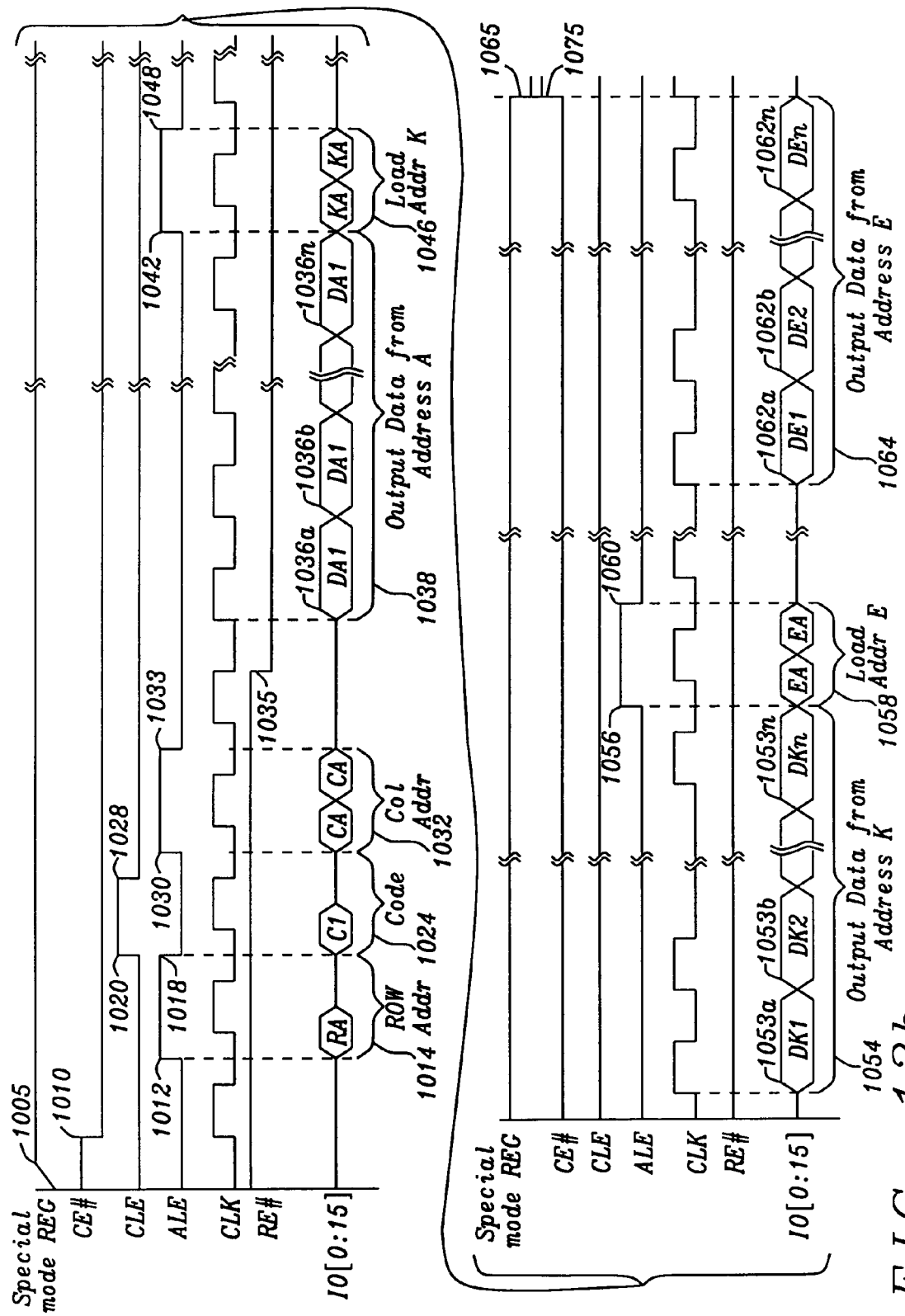
FIG. 13b is a timing diagram illustrating the waveforms of the parallel interface for an Address Ahead Input Read operation of NAND or NOR nonvolatile memory arrays of a nonvolatile memory device embodying the principles of this invention.

FIG. 13a is a flow chart of a method for an Address Ahead Input Read operation of NAND or NOR nonvolatile memory array elements 100 or 105 of a nonvolatile memory device 100 of FIG. 2. FIG. 13b is a timing diagram illustrating the waveforms of the parallel interface for an Address Ahead Input Read operation of NAND or NOR nonvolatile memory array elements 100 or 105 of a nonvolatile memory device 100 of FIG. 2. Referring to FIGS. 13a and 13b, the protocol is structured such that an Address Ahead Read operation is initiated at the activation 1000 of the special mode of operation by the activation 1005 of the special mode register. The special mode register is activated as a result of a previous command transmitted from the host electronic device 5 and executed by the control circuitry of the NAND nonvolatile memory array elements 100 and NOR nonvolatile memory array elements 105 multiple nonvolatile memory units 70a, 70b, ..., 70n. The chip enable signal CE# is activated 1010. With the activation 1012 of the Address Latch Enable signal ALE for receiving and decoding (Box 1015) a row address code 1014. The row address code 1014 describes the row of the selected NAND nonvolatile memory array elements 100 and NOR nonvolatile memory arrays 105 that are to be read.

The Address Latch Enable signal ALE is deactivated 1018 and the Command Latch Enable signal CLE is activated 1020 to receive and decode (Box 1022) the command code 1024. The command code 1024 describes that the action to be executed is an Address Ahead Read operation in which the read operation for a selected NAND or NOR nonvolatile memory array elements 100 or 105 has the row address in process. The command code 1024 is determined (Box 1026) if it an Address Ahead Read operation. If it is not an Address Ahead Read operation, the operation is ended. If the operation is an Address Ahead Read operation, the Command Latch Enable signal CLE is deactivated 1028 and the address latch enable ALE is activated 1030. The column address 1032 for the location of the initial data to be read is received and decoded (Box 1034). The current address pointer (not shown) within the parallel interface control circuit 110 of FIG. 2 is set (Box 1050) to the decoded starting column address 1032. The address latch enable ALE is deactivated 1033. After a delay, the Read Enable signal RE# is activated 1035 and the first addressed data 1036a is transferred (Box 1037) from the selected NAND or NOR nonvolatile memory array elements 100 or 105 to the parallel interface Input/Output bus 75 of FIG. 2.

The read operation (Box 1037) as described above is in progress with the chip enable signal CE# at the low state (logical "0") and the clock signal CLK being transferred with a duty cycle of approximately 50%. The address pointer is incremented. The address latch enable ALE is examined (Box 1040) if it has been activated 1042. If the Address Latch Enable signal ALE has not been activated 1042, the special mode register and the chip enable signal CE# are examined (Box 1052) to determine that a Address Ahead Read operation has ended the selected NAND nonvolatile memory array elements 100 or NOR nonvolatile memory array elements 105 have exited the special mode. If Address Ahead Read operation has not ended, the output data 1036b for the next incremented address is transferred (Box 1037) to the parallel interface Input/Output bus 75.

This process continues for the reading of the data segments 1037a, 1037b, ..., 1037n of the first data output 1038 until the address latch enable ALE is found to be activated 1042 when examined (Box 1040). The new address 1046 for the location of the second data 1054 to be read is received and decoded (Box 1044). The current address pointer (not shown) within the parallel interface control circuit 110 of FIG. 2 is set (Box 1050) to the decoded new address 1046. After a delay time, the first addressed data segment 1053a is transferred (Box 1037) from the selected NAND or NOR nonvolatile memory array elements 100 or 105 to the parallel interface Input/Output bus 75 of FIG. 2. The address pointer is incremented. The address latch enable ALE is examined (Box 1023) if it has been activated 1056. If it has not been activated 1056, the special mode register and the chip enable signal CE# are examined (Box 1052) to determine that a read operation has ended. If read operation has not ended, the output data 1053b for the next operation address is transferred (Box 1037) to the parallel interface Input/Output bus 75.

This process continues for the reading of the data segments 1053a, 1053b, . . . , 1053n of the second data output 1054 until the address latch enable ALE is found to be activated 1056 when examined (Box 1040). The next new address 1058 for the location of the third data 1064 to be read is received and decoded (Box 1044). The current address pointer (not shown) within the parallel interface control circuit 110 of FIG. 2 is set (Box 1050) to the decoded third jump address 1058. After a delay time, the first addressed data segment 1063a of the third address data 1064 is transferred (Box 1037) from the selected NAND or NOR nonvolatile memory array elements 100 or 105 to the parallel interface Input/Output bus 75 of FIG. 2.

The address pointer is incremented. The address latch enable ALE is examined (Box 1040) if it has been activated. If it has not been activated, the special mode register and the chip enable signal CE# are examined (Box 1052) to determine that an Address Ahead Read operation has ended. If read operation has not ended, the output data 1062b for the next incremented address is transferred (Box 1037) to the parallel interface Input/Output bus 75.

This process continues for the reading of the data segments 1062a, 1062b, . . . , 1062n of the third data output 1064 until the special mode register is deactivated 1065 and the chip enable signal CE# is found to be deactivated 1075 when examined (Box 1053). Any number of address jumps may occur until the special mode register is found to be deactivated 1065 and the chip enable signal CE# is found to be deactivated 1075 when examined (Box 1052) to end the Address Ahead Read operation.

FIGS. 14a, 14b and 14c are a table of the operational modes of the multiple nonvolatile memory units 70a, 70b, . . . , 70n of the nonvolatile memory device 10 of FIG. 1. The basic operational modes are:

1. a read from either the NAND memory array element 100 or a NOR memory array element 105 or one sub-array of the NAND memory array element 100 or a NOR memory array element 105 of FIG. 2, while writing to the other NAND memory array element 100 or a NOR memory array element 105 or the sub-array of the NAND memory array element 100 or a NOR memory array element 105.
2. a write to either the NAND memory array element 100 or a NOR memory array element 105 or one sub-array of the NAND memory array element 100 or a NOR memory array element 105 of FIG. 2, while read from the other NAND memory array element 100 or a NOR memory array element 105 or the sub-array of the NAND memory array element 100 or a NOR memory array element 105.
3. a read from either the NAND memory array element 100 or a NOR memory array element 105 or one sub-array of the NAND memory array element 100 or a NOR memory array element 105 of FIG. 2, while reading from the other NAND memory array element 100 or a NOR memory array element 105 or the sub-array of the NAND memory array element 100 or a NOR memory array element 105.
4. a write to either the NAND memory array element 100 or a NOR memory array element 105 or one sub-array of the NAND memory array element 100 or a NOR memory array element 105 of FIG. 2, while writing to other NAND memory array element 100 and a NOR memory array element 105 or the sub-array of the NAND memory array element 100 or a NOR memory array element 105.

It should be noted that the operational modes are also between the multiple nonvolatile memory units 70a, 70b, . . . , 70n as well as between the NAND memory array element 100 and a NOR memory array element 105 of each of the multiple nonvolatile memory units 70a, 70b, . . . , 70n or between the sub-arrays of each of the NAND memory array element 100 and a NOR memory array element 105.

The operational modes as shown are combinations of the command structures as above described and the internal processes that the multiple nonvolatile memory units 70a, 70b, . . . , 70n employ in performing the read, erase and program operations for the NAND memory array elements 100100 and a NOR memory array elements 105 within each of the multiple nonvolatile memory units 70a, 70b, . . . , 70n. The column labeled Operational Mode represents the combinations of read and write operations and the wave forms of the signals of the parallel communication interface 15. The column labeled the Figs. for Operation provides the figures that describe the command operations that are combined to create the operational modes. As an example to guide in the understanding of the table of FIGS. 14a, 14b, and 14c, in the operational mode read a NOR array while writing to a separate sub-array of the NOR array or to a NOR array in a separate multiple nonvolatile memory units 70a, 70b, . . . , 70n, the host electronic device 5 of FIG. 1 issues either an erase operation for a NOR array or sub-array as illustrated in FIG. 8 or a program of a NOR array or sub-array as illustrated in FIG. 9 followed by a NOR read as illustrated in FIG. 5b.

FIG. 5b represents the signal waveforms and timing for the NAND or NOR Read. FIG. 6b represents the signal waveforms and timing for the concurrent NAND and NOR Read. FIG. 7b represents the signal waveforms and timing for the NAND and NOR mixed Random Read. FIG. 8 represents the signal waveforms and timing for the NAND or NOR Erase. FIG. 9 represents the signal waveforms and timing for the NAND or NOR Program. FIG. 10 represents the signal waveforms and timing for the NAND or NOR Status Register Read. FIG. 11b represents the signal waveforms and timing for the Read Resume operation. FIG. 12b is a timing diagram for a Read Jump operation. FIG. 13b is a timing diagram for an Address Ahead Read.

The nonvolatile memory device 10 of FIG. 1 integrates multiple NAND and NOR nonvolatile memory units 70a, 70b, . . . , 70n into a single memory element for a hybrid user data, code data for a permanent memory and a cache storage of a temporary memory for electronic systems such as consumer devices for example the next generation mobile phones. The chip combines the extremely high-density fast random-access NOR, extremely high-density relatively slow serial-read NAND on one chip by using a unified low-cost NAND manufacturing process and cell. The nonvolatile memory device 10 uses synchronous parallel communication interface 15 that provides a parallel interface Input/Output bus 75 that is configurable to provide a variable data width from a single bit transmission to any number of parallel bits dependent upon restrictions of the number of terminals allowable on the physical structure (chip, module, board). The parallel communication interface 15 supports a double edge read mode which allows the chip output data at the falling edge and rising edge of the clock signal CLK to double the read speed. The structure of the command set and the partitioning of the multiple nonvolatile memory units 70a, 70b, . . . , 70n permits concurrent reading and writing, as described in FIGS. 14a, 14b, and 14c, between the multiple nonvolatile memory units 70a, 70b, . . . , 70n, between the NAND memory array elements 100\ and a NOR memory array elements 105 of FIG. 2 within each of the multiple nonvolatile memory units 70a, 70b, . . . , 70n, and between the sub-arrays of the NAND memory array element 100 and a NOR memory array element 105.

While this invention has been particularly shown and described with reference to the preferred embodiments thereof, it will be understood by those skilled in the art that various changes in form and details may be made without departing from the spirit and scope of the invention.

The invention claimed is:

1. A nonvolatile memory device comprising:
a plurality independent nonvolatile memory arrays;
wherein the multiple independent nonvolatile memory arrays function concurrently for parallel reading and writing of the multiple independent nonvolatile memory arrays; and
a parallel interface in communication with the plurality independent nonvolatile memory arrays for communication of commands, address, device status, and data between a master device and the plurality independent nonvolatile memory arrays for concurrently reading and writing of the plurality independent nonvolatile memory arrays;
wherein one command indicates that a read operation at one location is to be interrupted and the read operation is to be relocated to a second address; and
wherein the reading of one of the plurality independent nonvolatile memory arrays is interrupted for another operation with the enable signal and the reading resumed with the enable signal and a resume command from the command code.

2. The nonvolatile memory device of claim 1 wherein each of the plurality independent nonvolatile memory arrays are a NAND array or a NOR array.

3. The nonvolatile memory device of claim 2 wherein the NOR array comprises a plurality of a NAND like dual charge retaining transistor flash NOR memory cells arrange in rows and columns.

4. The nonvolatile memory device of claim 2 wherein the NAND array and the NOR array are partitioned into a plurality of sub-arrays wherein each sub-array is written to or read from concurrently while other sub-arrays being written to or read from.

5. The nonvolatile memory device of claim 1 wherein data is transferred on the parallel interface at the rising edge and the falling edge of the synchronizing clock.

6. The nonvolatile memory device of claim 1 wherein the parallel interface transmits a command code and an address code from the master device and transfers a data code between the master device and the nonvolatile memory device, wherein the data code has a length that is determined by the command code and a location determined by the address code such that the data code has a variable length.

7. The nonvolatile memory device of claim 6 wherein the parallel interface has an enable signal that when activated defines a beginning of the command code and when deactivated terminates a transfer of the data code.

8. The nonvolatile memory device of claim 1 wherein a second command indicates that a read operation is to be executed with a first address; and a second address received and decoded separately to locate selected data within one of the multiple nonvolatile memory arrays such that the first address is received from the parallel interface prior to the second command to initiate required circuitry.

9. The nonvolatile memory device of claim 8 wherein the first address is a row address and the required circuitry is the row latching driver circuitry that has large capacitance loads that require time for charging.

10. A nonvolatile memory device comprising:
a plurality of nonvolatile memory arrays, wherein each of the plurality of nonvolatile memory arrays comprises independent address, control, status, and data control circuitry; and
a parallel communication interface circuit for communicating between the independent address, control, status, and data control circuitry and an external control device with a master clock signal, multiple control signals, and a parallel data bus, wherein the parallel interface communication circuit uses the master clock signal for capturing of the control signals, the interface communication circuit decodes the control signals to activate the nonvolatile memory device, and to determine the commands to be executed by the nonvolatile memory device;
an address decoder circuit connected to the parallel data bus to receive the address signal designating the location of the data to be read or written to selected locations within the plurality of nonvolatile memory arrays; and
a data multiplexer connected to the nonvolatile memory arrays for receiving data signals read from selected locations of the nonvolatile memory array, wherein the data multiplexer serializes the data signals that are concurrently read from selected nonvolatile memory arrays and transmits the data signals on the parallel data bus.

11. The nonvolatile memory device of claim 10 wherein each of the plurality of nonvolatile memory arrays is a NAND array, NOR array, or other type of nonvolatile memory array.

12. The nonvolatile memory device of claim 10 wherein the NOR array is a NAND like dual charge retaining transistor NOR flash nonvolatile memory array.

13. The nonvolatile memory device of claim 10 wherein the decoded commands are transmitted to the control circuitry within the plurality of nonvolatile memory arrays for execution of the commands.

14. The nonvolatile memory device of claim 10 wherein the interface communication circuit further receives the address and data signals from the parallel data bus for distribution to selected locations within the nonvolatile memory arrays.

15. The nonvolatile memory device of claim 10 wherein the control signals received by the parallel communication interface circuit command that a read operation at one location be interrupted and the read operation is relocated to a second address, such that the second address is decoded by the address decoder and the data of the second location is transferred subsequent to the data from the first location.

16. The nonvolatile memory device of claim 10 wherein the control signals received by the parallel communication interface circuit command that a read operation be executed wherein two separate addresses are received and decoded separately to define a row address and a column address within one of the plurality of nonvolatile memory arrays.

17. The nonvolatile memory device of claim 16 wherein one address of the two separate addresses defining the row address is transferred directly to a row latching drive and the other address of the two separate addresses defining the column address is transferred to a column latching driver of the selected one of the plurality of nonvolatile memory arrays, wherein the data located at the location designated by the two separate addresses is transferred to the parallel data bus.

18. The nonvolatile memory device of claim 10 wherein each of the plurality of nonvolatile memory arrays is divided into a plurality of sub-arrays that is independently and concurrently read from or written to.

19. The nonvolatile memory device of claim 18 wherein a write operation for the plurality of nonvolatile memory arrays includes a program operation and an erase operation.

20. The nonvolatile memory device of claim 10 wherein each of the sub-arrays is receiving data signals from the parallel data bus while programming data to selected memory cells of the nonvolatile memory sub-array.

21. The nonvolatile memory device of claim 10 wherein the coding of the control signals define that some of the nonvolatile memory arrays are being read, others of the nonvolatile memory arrays are being erased and still others are being programmed.

22. An electronic device comprising:
a host processing circuit for receiving, processing, and storing data;
a host master controller in communication with the host processing circuit for generating command signals, control signals, address signals, and write data signals;
at least one nonvolatile memory device in communication with the host master controller wherein the at least one nonvolatile memory device comprises a parallel communication interface circuit for the communication of the command signals, control signals, address signals, and write data signals from the host master controller to the slave device and read data signals and device status signals from the slave device to the host master controller;
an address decoder circuit connected to the parallel data bus to receive the address signal designating the location of the data to be read from or written to selected locations within the nonvolatile memory arrays; and
a data multiplexer connected to the nonvolatile memory arrays for receiving data signals read from selected locations of the nonvolatile memory array.

23. The electronic device of claim 22 wherein the memory device comprises:
a plurality of nonvolatile memory arrays, wherein each of the plurality of nonvolatile memory arrays has independent address, control, status, and data control circuitry.

24. The electronic device of claim 23 wherein each of the plurality of nonvolatile memory arrays is a NAND array, NOR array, or other type of nonvolatile memory array.

25. The electronic device of claim 24 wherein the NOR array is a NAND like dual charge retaining transistor NOR flash nonvolatile memory array.

26. The electronic device of claim 22 wherein the parallel communication interface circuit is in communication with the host master controller through a master clock signal, multiple control signals, and a parallel data bus, wherein the parallel interface communication circuit uses the master clock signal for capturing of the control signals, the interface communication circuit decodes the control signals to activate the nonvolatile memory device, and to determine the commands to be executed by the nonvolatile memory device.

27. The electronic device of claim 26 wherein the decoded commands are transmitted to the control circuitry within the plurality of nonvolatile memory arrays for execution of the commands, wherein the interface communication circuit further receives the data signals from the parallel data bus for distribution to selected locations within the nonvolatile memory arrays.

28. The electronic device of claim 22 wherein the data multiplexer serializes the data signals that are concurrently read from selected nonvolatile memory arrays and transmits the data signals on the parallel data bus.

29. The electronic device of claim 22 wherein each of the nonvolatile memory arrays is divided into a plurality of sub-arrays that is independently and concurrently read from or written to.

30. The electronic device of claim 22 wherein a write operation for the plurality of nonvolatile memory arrays includes a program operation and an erase operation.

31. The electronic device of claim 22 wherein each of the sub-arrays is receiving data signals from the parallel data bus while programming data to selected memory cells of the nonvolatile memory sub-array.

32. The electronic device of claim 22 wherein the coding of the control signals define that some of the nonvolatile memory arrays are being read, others of the nonvolatile memory arrays are being erased and still others are being programmed.

33. A method for controlling a plurality of nonvolatile memory devices comprising:
providing the plurality of nonvolatile memory devices wherein each of the nonvolatile memory devices comprises a plurality of nonvolatile memory arrays, wherein each of the plurality of nonvolatile memory arrays comprises independent address, control, status, and data control circuitry;
communicating commands, address, and write data to each of the plurality nonvolatile memory devices on a parallel data bus; and
receiving read data and device status from each of the plurality of nonvolatile memory devices;
receiving the data signals from the parallel data bus for distribution to selected locations within the nonvolatile memory arrays identified by the address signals; and
receiving and decoding the address signal designating the location of the data to be read or written to selected locations within the nonvolatile memory arrays are read from the parallel data bus is;
serializing and transmitting the data signals concurrently read from selected locations of the nonvolatile memory array to the parallel data bus.

34. The method for controlling a plurality of nonvolatile memory devices of claim 33 wherein each of the plurality of nonvolatile memory arrays is a NAND array, NOR array, or other type of nonvolatile memory array.

35. The method for controlling a plurality of nonvolatile memory devices of claim 34 wherein each of the NOR arrays are a NAND like dual charge retaining transistor NOR flash nonvolatile memory array.

36. The method for controlling a plurality of nonvolatile memory devices of claim 33 further comprises:
receiving a master clock signal, a chip enable signal, and a serial data signal by each of the plurality of nonvolatile memory devices from the parallel data bus;
capturing with the master clock signal the control signals received from the parallel data bus;
decoding the control signals to activate each of the plurality of nonvolatile memory devices; and
determining the commands to be executed by each of the plurality of nonvolatile memory devices;
transmitting the decoded commands for execution by the plurality of nonvolatile memory arrays; and
receiving the data signals from the parallel data bus for distribution to selected locations within the nonvolatile memory arrays identified by the address signals.

37. The method for controlling a plurality of nonvolatile memory devices of claim 36 wherein the coding of the control signals define that some of the nonvolatile memory arrays are being read, others of the nonvolatile memory arrays are being erased and still others are being programmed.

38. The method for controlling a plurality of nonvolatile memory devices of claim 33 wherein the control signals indicate that a read operation at one location is to be interrupted and the read operation is to be relocated to a second address, such that the second address is decoded and the data of the second location is transferred subsequent to the data from the first location.

39. The method for controlling a plurality of nonvolatile memory devices of claim 33 wherein the control signals indicates that a read operation is to be executed wherein two separate addresses are received and decoded separately to define a row address and a column address within one of the plurality of nonvolatile memory arrays.

40. The method for controlling a plurality of nonvolatile memory devices of claim 39 wherein one address of the two separate addresses defining the row address is transferred directly to a row latching driver and the other address of the two separate addresses defining the column address is transferred to a column latching driver of the selected one of the plurality of nonvolatile memory arrays, such that the data located at the location designated by the two separate addresses is transferred to the parallel data bus.

41. The method for controlling a plurality of nonvolatile memory devices of claim 33 wherein providing the nonvolatile memory devices comprises dividing each of the nonvolatile memory arrays into a plurality of sub-arrays that is independently and concurrently read from or written to.

42. The method for controlling a plurality of nonvolatile memory devices of claim 41 wherein a write operation for the plurality of nonvolatile memory arrays includes a program operation and an erase operation, such that each of the sub-arrays is receiving data signals from the parallel data bus while programming data to selected memory cells of the nonvolatile memory sub-array.

\* \* \* \* \*